United States Patent
Darling et al.

(10) Patent No.: US 9,684,234 B2
(45) Date of Patent: Jun. 20, 2017

(54) SEQUENTIAL INFILTRATION SYNTHESIS FOR ENHANCING MULTIPLE-PATTERNING LITHOGRAPHY

(71) Applicant: UChicago Argonne LLC, Argonne, IL (US)

(72) Inventors: Seth B. Darling, Chicago, IL (US); Jeffrey W. Elam, Elmhurst, IL (US); Yu-Chih Tseng, Westmont, IL (US)

(73) Assignee: UCHICAGO ARGONNE, LLC, Chicago, IL (US)

( * ) Notice: Subject to any disclaimer, the term of this patent is extended or adjusted under 35 U.S.C. 154(b) by 0 days.

(21) Appl. No.: 13/902,169

(22) Filed: May 24, 2013

(65) Prior Publication Data

US 2013/0256265 A1  Oct. 3, 2013

Related U.S. Application Data

(63) Continuation-in-part of application No. 13/427,619, filed on Mar. 22, 2012, now Pat. No. 8,980,418.

(60) Provisional application No. 61/467,166, filed on Mar. 24, 2011.

(51) Int. Cl.

| | | |
|---|---|---|
| C03C 15/00 | (2006.01) |
| G03F 7/00 | (2006.01) |
| G03F 7/40 | (2006.01) |
| H01L 21/027 | (2006.01) |
| H01L 21/3065 | (2006.01) |
| H01L 21/308 | (2006.01) |

(52) U.S. Cl.
CPC ............ *G03F 7/0002* (2013.01); *G03F 7/405* (2013.01); *H01L 21/0273* (2013.01); *H01L 21/3065* (2013.01); *H01L 21/3081* (2013.01); *H01L 21/3086* (2013.01)

(58) Field of Classification Search
CPC ............ H01L 21/0332; H01L 21/0273; H01L 21/3065; H01L 21/3081; H01L 21/3086; G03F 7/0035
USPC .................. 216/41, 47, 49, 51; 438/725, 736
See application file for complete search history.

(56) References Cited

U.S. PATENT DOCUMENTS

| | | | |
|---|---|---|---|
| 6,162,591 | A | 12/2000 | Gao et al. |
| 8,900,467 | B1 | 12/2014 | Chapuis et al. |
| 8,986,562 | B2 | 3/2015 | Zafiropoulo et al. |
| 9,416,447 | B2 | 8/2016 | Arora et al. |
| 9,487,600 | B2 | 11/2016 | Darling et al. |

(Continued)

FOREIGN PATENT DOCUMENTS

WO    WO 2008/135749    11/2008

OTHER PUBLICATIONS

Amirtharaj et al. "Double Patterning and Hyper-Numerical Aperture Immersion Lithography" via http://www.ece.umd.edu/class/enee416/GroupActivities/Lithography%20Presentation.pdf ; Nov. 17, 2011.*

(Continued)

*Primary Examiner* — Binh X Tran
(74) *Attorney, Agent, or Firm* — Foley & Lardner LLP

(57) ABSTRACT

Simplified methods of multiple-patterning photolithography using sequential infiltration synthesis to modify the photoresist such that it withstands plasma etching better than unmodified resist and replaces one or more hard masks and/or a freezing step in MPL processes including litho-etch-litho-etch photolithography or litho-freeze-litho-etch photolithography.

14 Claims, 26 Drawing Sheets

(56) References Cited

U.S. PATENT DOCUMENTS

| | | |
|---|---|---|
| 2005/0103748 A1 | 5/2005 | Yamaguchi et al. |
| 2006/0231525 A1 | 10/2006 | Asakawa et al. |
| 2009/0101985 A1 | 4/2009 | Fuller et al. |
| 2010/0092873 A1* | 4/2010 | Sills .................. B81C 1/00031 430/5 |
| 2010/0248476 A1 | 9/2010 | Sera et al. |
| 2012/0046421 A1 | 2/2012 | Darling et al. |
| 2012/0241411 A1 | 9/2012 | Darling et al. |
| 2013/0157409 A1 | 6/2013 | Vaidya et al. |

OTHER PUBLICATIONS

Lucas et al. "Triple patterning in 10 nm mode metal lithography" http://spie.org/x91233.xml ; Nov. 26, 2012.*

Tanishiro, et al., *UHV Transmission Electron Microscopy on the Reconstructed Surface of (111) Gold*, Surface Science 111 (1981) pp. 395-413, North-Holland Publishing Company.

Pierrat, et al., *Prime Process for Deep UV and e-beam Lithography*, Microelectronic Engineering (1990), pp. 507-514, vol. 11, MElsevier Science Publishers B.V.

Hutton, et al, *Application of Plasmask® Resist and the Desire Process to Lithography at 248 nm*, J. Vac. Sci. Technol. (Nov./Dec. 1990), pp. 1502-1508, vol. 8, No. 6, American Vacuum Society.

Thackeray, et al., *Approaches to Deep Ultraviolet Photolithography Utilizing Acid Hardened Resin Photoresist Systems*, J. Vac. Sci. Technol. (1989), pp. 1620-1623, vol. 7, No. 6, American Vacuum Society.

Kontziampasis, et al., *Optimized Surface Silylation of Chemically Amplified Expoxidized Photoresists for Micromachining Applications*, Journal of Applied Polymer Science, (2010), pp. 2189-2195, vol. 117, Wiley Periodicals, Inc.

Hartney, et al., *Silylation Processes for 193-nm Excimer Laser Lithography*, Advances in Resist Technology and Processing VI (1990), pp. 119-130, vol. 1262, SPIE.

Somervell, et al., *Study of the Fundamental Contributions to Line Edge Roughness in a 193 nm, Top Surface Imaging Systems*, J. Vac. Sci. Technol. (Sep./Oct. 2000), pp. 2551-2559, vol. B 18, No. 5, American Vacuum Society.

Vertommen, et al., *Integrated Silylation and Dry Development of Resist for sub-0.15 µm Top Surface Imaging Applications*, Journal of Photopolymer Science and Technology, (1998), pp. 597-612, vol. 11, No. 4.

Mori, et al., *Reduction of Line Edge Roughness in the Top Surface Imaging Process*, J. Vac. Sci. Technol., (Nov./Dec. 1998), pp. 3739-3743, vol. 16, No. 6, American Vacuum Society.

Luo, *Optical Characterization and Process Control of Top Surface Imaging*, Mat. Res. Soc. Symp. Proc., (2000), pp. 183-188, vol. 584, Materials research Society.

Satou, et al., *Study of Bi-layer Silylation Process for 193 nm Lithography*, Part of SPIE Conference on Advances in Resist Technology and Processing XVI, (Mar. 1999), pp. 251-261, vol. 3678, SPIE, Santa Clara, California, USA.

Endo, et al., *High Sensitive Negative Silylation Process for 193nm Lithography*, Microelectronic Engineering, (2000), pp. 485-488, vol. 53, Elsevier Science B.V.

Tseng, et al., *Enhanced Polymeric Lithography Resists via Sequential Infiltration Synthesis*, Journal of Materials Chemistry, (2011), pp. 11722-11725, vol. 21.

Tseng, et al., *Enhanced Lithographic Imaging Layer Meets Semiconductor Manufacturing Specification a Decade Early*, Advanced Materials (2012), pp. 2608-2613, vol. 24.

Peng, et al., *Nanoscopic Patterned Materials with Tunable Dimensions via Atomic Layer Deposition on Block Copolymers*, Advanced Materials (2010), pp. 5129-5133, vol. 22, Material Views.

Peng, et al., *A Route to nanoscopic Materials via Sequential Infiltration Synthesis on Block Colpolymer Templates*, ACS Nano (2011), pp. 4600-4606, vol. 5, No. 6.

Tseng, et al., *Enhanced Block Copolymer Lithography Using Sequential Infiltration Synthesis*, The Journal of Physical Chemistry (2011), pp. 17725-17729, vol. 115, American Chemical Society.

Tseng, et al., *Etch Properties of Resists Modified by Sequential Infiltration System*, J. Vac. Sci. Technol. (Dec. 2011), pp. 06FG01-1-06FG01-4, vol. B 29(6), American Vacuum Society.

Poirier, et al., *Two-Dimensional Liquid Phase and the px√3 Phase of Alkanethiol Self-Assembled Monolayers on Au(111)*, Langmuir (1994), pp. 3383-3386, vol. 10, American Chemical Society.

Goldfarb, et al., *Effect of Thin-Film Imaging on Line Edge Roughness Transfer to Underlayers During Etch Processes*, J. Vac. Sci. Technol. (Mar./Apr. 2004), pp. 647-653, vol. B22(2), American Vacuum Society.

Oehrlein, et al., *Plasma polymer Interactions: A review of Progress in Understanding Polymer Resist Mask Durability During Plasma Etching for Nanoscale Fabrication*, J. Vac. Sci. Technol. (Jan./Feb. 2011), pp. 010801-1-010801-35, vol. 29, No. 1, American Vacuum Society.

Lee, et al., *Mobility Analysis of Surface Roughness Scattering in FinFET Devices, Solid-State Electronics*, (2011), pp. 195-201, vol. 62, Elsevier Ltd.

Diaz, et al., *An Experimentally Validated Analytical Model for Gate Line-Edge Roufhness (LER) Effects on Technoloyg Scaling*, IEEE Electron Device Letters (Jun. 2001), pp. 287-289, vol. 22, No. 6.

Baravelli, et al., $V_{DD}$ *Scalability of FinFet SRAMS: Robustness of Different Design Options Against LER-induced Variations*, Solid-State Electronics (2010) pp. 909-918, vol. 54, Elsevier Ltd.

Ye et al., *Statistical Modeling and Simulation of Threshold Variation Under Random Dopant Fluctuations and Line-Edge Roughness*, IEEE Transactions on Very Large Scale Integration (VLSI) Systems (Jun. 2011), pp. 987-996, vol. 19, No. 6.

Xiong, et al., *Study of Gate Line Edge Roughness Effects in 50 nm Bulk MOSFET Devices*, Metrology, Inspection and Process Control for Microlithography XVI, (2002), pp. 733-741, vol. 4689, SPIE.

Ma, et al., *Line Edge Roughness of Sub-100 nm Dense and Isolated Features: Experimental Study*, J. Vac. Sci. Technol. (Nov./Dec. 2003), pp. 3124-3130, vol. 21, No. 6, American Vacuum Society.

Rio, et al., *Study on Line Edge Roughness for Electron Beam Acceleration Voltages from 50 to 5 kV*, J. Vac. Sci. Technol. (Nov./Dec. 2009), pp. 2512-2517, vol. 27, No. 6, American Vacuum Society.

OLynick, et al., *25 nm Mechanically Buttressed High Aspect Ration Zone Plates: Fabrication and Performance*, J. Vac. Sci. Technol. (2004), pp. 3186-3190, vol. 22, No. 6, American Vacuum Society.

Dreeskornfeld, et al., *High Precision Etching of Si/SiO$_2$ on a High-Density Helicon Etcher for Nanoscale Devices*, Joyrnal of the Electrochemical Society (2003), pp. G702-G706, vol. 150, The Electrochemical Society.

Tuda, *Profile Evolution During Polysilicon Gate Etching With Low-Pressure High-Density Cl$_2$/HBr/O$_2$ Plasma Chemistries*, J. Vac. Sci. Technol. (May/Jun. 2001) , pp. 711-717, vol. A 19(3), American Vacuum Society.

Frase, et al., *CD Characterization of Nanostructures in SEM Metrology*, Meas. Sci. Technol. (2007), pp. 510-519, vol. 18, IOP Lublishing Ltd., UK.

Ras, et al., *Hollow Inorganic Nanospheres and Nanotubes with Tunable Wall Thickness by Atomic Layer Deposition on Self-Assembled Polymeric Templates*, Advanced Materials (Jan. 2007), pp. 102-106, vol. 19, VCH Verlag GmbH & Co. KGaA, Weinheim.

Lopes, et al., *Hierarchical Self-Assembly of Metal Nanostructures on Diblock Copolymer Scaffolds*, Nature (Dec. 13, 2001), pp. 735-738, vol. 414, Macmillan Magazine.

Office Action dated May 1, 2014 for U.S. Appl. No. 13/209,190, 10 pages.

Park, et al., "Block Copolymer Lithography: Periodic Arrays of 10-11, Holes in 1 Square Centimeter", Science, (1997) Science vol. 276, pp. 1401-1404.

Non-Final Office Action on U.S. Appl. No. 13/209,190 dated Oct. 16, 2013, 10 pages.

Non-Final Office Action on U.S. Appl. No. 13/427,619 dated Mar. 11, 2014, 21 pages.

(56) References Cited

OTHER PUBLICATIONS

Final Office Action on U.S. Appl. No. 13/427,69 dated Aug. 13, 2014, 22 pages.
Amirtharaj et al. "Double Patterning and Hyper-Numerical Aperture Immersion Lithography" via http://www.ece.umd.edu/class/enee416/GroupActivities/Lithography%20Presentation.pdf; Nov. 17, 2011.
Office Action for U.S. Appl. No. 13/209,190, dated Jun. 10, 2015, 12 pages.
Wang, et al., Nanoscopic Morphologies in Block Copolymer Nanorods as Templates for Atomic-Layer Deposition of Semiconductors, Advanced Materials 2009, 21, 2763-2766, 4 pages.
Non-Final Office Action for U.S. Appl. No. 13/209,190 dated Sep. 21, 2015, 13 pages.
Office Action for U.S. Appl. No. 13/209,190, mail date Apr. 6, 2016, 14 pages.
Notice of Allowance for U.S. Appl. No. 13/209,190, mail date Jun. 17, 2016, 7 pages.
Office Action for U.S. Appl. No. 14/645,162, mail date Nov. 18, 2016, 13 pages.

\* cited by examiner

Litho-Etch-Litho-Etch (LELE)

1. Litho 1. The first pattern (yellow) is exposed onto the first hard mask (orange). 

2. Etch 1. The first pattern is etched into the first hard mask (orange). 

3. Litho 2. The second pattern is exposed onto the second hard mask (blue), doubling pattern density. 

4. Etch 2. The second pattern is etched into the second hard mask (blue). 

5. Pattern transfer. The combined pattern is etched into the target material (grey). 

6. Hard mask strip. The hard masks are stripped away. 

Litho-Freeze-Litho-Etch (LFLE)

1. Litho 1. The first pattern (yellow) is exposed onto the first hard mask (blue). 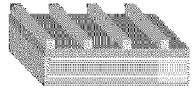

2. Freeze. Coat with new resist. The developed pattern is frozen and a second coat of resist is applied. 

3. Litho 2. The second pattern (yellow) is exposed, doubling pattern density. The first pattern (orange) was preserved from the previous freezing step. 

4. Etch. The combined pattern is etched into the hard mask (blue). 

5. Pattern transfer. The combined pattern is etched into the target material (grey). 

6. Hard mask strip. The hard mask is stripped away. 

FIG. 1

SEQUENTIAL INFILTRATION SYNTHESIS FOR ENHANCING MULTIPLE-PATTERNING LITHOGRAPHY

CROSS REFERENCE TO RELATED PATENT APPLICATIONS

The present application is a continuation-in-part of U.S. patent application Ser. No. 13/427,619, which was filed on Mar. 2, 2012, and published as US 2012/0241411, and which claims priority to U.S. Provisional Patent Application No. 61/467,166, now U.S. Pat. No. 8,980,418 filed Mar. 24, 2011, each of which is hereby incorporated herein by reference in its entirety.

STATEMENT OF GOVERNMENT INTEREST

The United States Government has rights in this invention pursuant to Contract No. DE-ACO2-06CH11357 between the United States Government and the UChicago Argonne, LLC, representing Argonne National Laboratory.

FIELD OF THE INVENTION

This invention relates to a method of photolithography. More specifically, this invention relates to novel multiple-patterning lithography methods in which one or more steps are replaced by sequential infiltration synthesis (SIS).

BACKGROUND OF THE INVENTION

This section is intended to provide a background or context to the invention that is, inter alia, recited in the claims. The description herein may include concepts that could be pursued, but are not necessarily ones that have been previously conceived or pursued. Therefore, unless otherwise indicated herein, what is described in this section is not prior art to the description and claims in this application and is not admitted to be prior art by inclusion in this section.

Photolithography is a process used in the fabrication of integrated circuits, which entails using light to transfer a pattern from a "mask" to a "photoresist" on a substrate. A series of chemical treatments are then applied in order to etch a desired pattern into the substrate. Improvements in photolithography have advanced integrated circuit manufacturing over the last several decades. The most important advance is the gradual reduction of the wavelength of the illumination source of the photolithography tool: from the 436 nm line of a mercury lamp to the 193 nm light of an ArF laser. By incrementally improving the photolithography process, features as small as 45 nm can be manufactured in high volume using 193 nm photolithography. Immersion 193 nm photolithography is presently deployed for the manufacturing of even more advanced technology nodes. To print even smaller features, several technologies have been considered, such as extreme ultraviolet lithography (EUVL). The development, however, has been delayed due to several difficulties, in particular the difficulty in designing a light source with sufficient brightness. Consequently, multiple-patterning techniques have emerged as an alternative. However, multiple-patterning achieves a fine feature size at a significant cost. In its simplest form, double-patterning, two separate masks and two exposure steps are required to achieve what a single mask and one exposure step used to accomplish, leading to a much lower throughput and significantly higher cost.

SUMMARY

The present invention addresses these problems and provides processes for preparing lower-cost, high-throughput multiple patterning photolithography. In some embodiments, sequential infiltration synthesis (SIS), a method related to atomic layer deposition (ALD), is used to increase the plasma etch resistance and/or render a photoresist layer insoluble in photoresist solvents, thus obviating the need for one or more steps of present techniques of multiple-patterning lithography. The SIS process utilizes alternating exposures to gas phase precursors that infiltrate the organic or partially organic resist material to form a protective component within the resist layer. These techniques modify the standard multiple-patterning lithography techniques to reduce the number of steps and/or decrease the cost and time that these techniques presently require. Potential applications of these methods and system extend to virtually all technologies in which periodic nanomaterial structures are desirable, including optoelectronics, sensors, membranes, photonic crystals, dielectric materials, and electronics.

In one aspect, a method is provided for preparing inorganic features with multiply-patterned nanostructures, comprising: modifying a resist material using SIS; etching the first pattern onto the substrate; preparing a second iteration of inorganic features onto the substrate to double the pattern density; and engraving the double-density pattern onto the substrate, wherein no hard mask is deposited between the substrate and the features.

In some embodiments, the resist is selected from the group consisting of polyacrylate(s), poly(vinyl pyridine)(s), poly(vinyl alcohol)(s), polysulfone(s), polyimide(s), and polyphosphate(s). In further embodiments, the method may be performed using litho-etch-litho-etch (LELE) multiple-patterning lithography modified such that hard mask deposition, transfer, and removal steps are replaced with SIS treatment steps.

In some embodiments the step of modifying the resist using SIS comprises the steps of exposing the resist to a plurality of SIS cycles comprising alternating exposures of a first precursor reactive with the organic resist and a second precursor reactive with the moieties created by the first precursor within the organic resist to form an inorganic protective etch component within the bulk organic resist mask layer.

In further embodiments, first precursor and the second precursor may comprise gas phase precursors. In still further embodiments, the first precursor may comprise a metal or metal-containing compound, and the inorganic protective etch component may comprise a metal oxide or a metal. In some embodiments, the metal oxide is selected from the group consisting of $Al_2O_3$, $ZnO$, $SiO_2$, $HfO_2$, $ZrO_2$, $Nb_2O_5$, and $TiO_2$. In further embodiments, the resist mask layer comprises at least one of poly(methyl methacrylate) (PMMA), ZEP520A, poly(methyl glutarimide) (PMGI), phenol formaldehyde resin (DNQ/Novolac), polyhydroxystyrene-based polymers, polyimides and SU-8.

In yet another embodiment, the step of SIS comprises the following steps: providing a substrate material and applying the resist mask layer over a surface of the substrate material, forming the patterned feature in the resist mask layer by lithography, and performing a plurality of SIS cycles. Each SIS cycle may comprise exposing the resist mask layer to a first precursor reactive with the first organic or partially organic material and exposing the resist mask layer to a second precursor to form a protective etch component within at least a portion of the first resist material.

In another aspect, a method is provided for preparing inorganic features with multiply-patterned nanostructures, comprising: exposing a pattern onto a substrate, preparing a second iteration of the pattern on the substrate using SIS to effectively double the density of the pattern features; and wherein no hard mask is deposited between the substrate and the pattern. In some embodiments, the method may be litho-freeze-litho-etch (LFLE) multiple-patterning lithography modified such that the resist freeze step is accomplished through SIS treatment. In further embodiments, the method may be LFLE multiple-patterning lithography modified such that the hard mask deposition, transfer, and removal steps are accomplished through SIS treatment.

These and other advantages and features of the invention, together with the organization and manner of operation thereof, will become apparent from the following detailed description when taken in conjunction with the accompanying drawings, wherein like elements have like numerals throughout the several drawings described below.

BRIEF DESCRIPTION OF THE DRAWINGS

FIG. 1 is a schematic showing LELE and LFLE and the steps that may be replaced using SIS.

FIG. 16A shows change in line width vs. SIS cycles; FIG. 16B shows the percent change in PMMA volume vs. SIS cycles. FIG. 16C shows line-edge roughness (LER) (1-sigma) prior to plasma etching of lithographically defined lines in the SIS-modified resist layer, as a function of SIS cycles;

In FIG. 17A, the top dashed line shows the ideal case where plasma etching has no effect on line width. The lower dotted line shows the best linear fit to data points, revealing a ~5 nm reduction in line width after plasma etching under these conditions. FIG. 17B shows a comparison of LER before and after plasma etching. LER is found to be unchanged within the error in metrology;

FIG. 18A show an array of test patterns from 30 nm wide lies to 110 nm-wide lines. FIG. 18B shows the details of the test pattern inside the box corresponding to FIG. 18A. The dark lines remain after development while the white areas are removed;

FIG. 19A shows the secondary-electron SEM image of the lines and FIG. 19B is a grey-scale average across the y-direction of the box as a function of position x in the same sample. The line width is taken as the distance Was shown in FIG. 19B;

FIG. 20A is a secondary-electron image of five (5) lines. FIG. 20B is a binary outline of the lines in the same sample. FIG. 20C is the grey-scale average across the y-direction as a function of position x (black line and symbols), along with a fit to the grey-scale average data using a Gaussian function with a standard deviation of 1.81 nm; FIG. 21A is a SEM image of the high aspect ration AFM tip used for measurements. FIG. 21B is an image for the image analysis software for measuring line width. FIG. 21C is in image from the image analysis software for determining line edge roughness (LER).

DETAILED DESCRIPTION OF EMBODIMENTS

Figure 2:
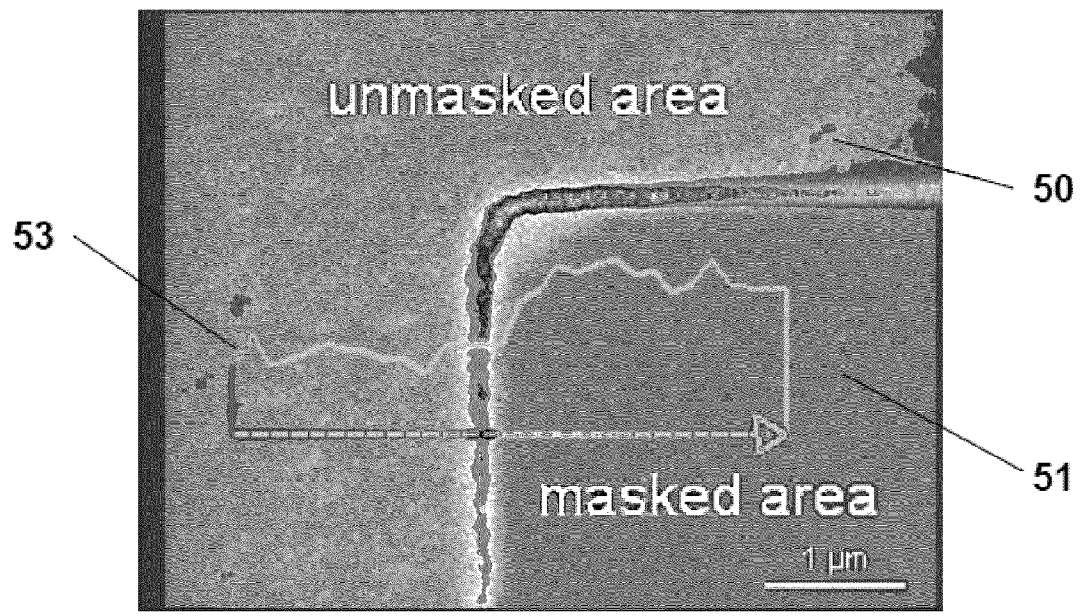
FIG. 2 shows a scanning electron micrograph and correlative energy dispersive X-ray (EDX) data of a SIS modified PMMA resist material layer according to an embodiment of the present invention after a two-minute silicon main etching step, the overlay curve plots the aluminum (Al) signal as a function of position.

The present invention provides improved methods for preparing low-cost, high-throughput patterned nanostructures of a broad variety of materials with smaller feature sizes by utilizing SIS to modify a resist material prior to performing MPL. The resulting nanostructures have a number of potential uses, including photovoltaic devices, structural supports for a separation membrane in a battery, a fluid filtration membrane, filtering and/or guiding selected wavelengths of light, as active channel material in a transistor, as an array emitter or a field emitter, a three-dimensional electrical contact, and a catalyst. In photovoltaic devices, nanostructures comprised of light absorbers, charge separation materials, and/or charge transport materials can outperform analogous devices without nanostructures—this is especially true in systems where bound excitons are formed such as in organic and hybrid organic/inorganic photovoltaics. The uniformity and tenability of spacing between nanostructures lends itself to separation and nanofiltration applications. Photonic crystals with uniformly spaced nanostructures are effective at manipulating and modulating light.

Sequential Infiltration Synthesis

In general, the SIS process involves exposing the patterned organic or partially organic resist material layer to various gas phase precursors to synthesize protective components in situ. SIS coats the surface of the resist material but also infiltrates into the bulk resist material as well. The gas phase precursors are selected for reaction with the resist material. A wide range of precursors are available for selection for SIS modification which are capable of forming inorganic protective components within a variety of organic resist materials. Examples of inorganic protective components prepared by SIS include $Al_2O_3$, $TiO_2$, ZnO, $SiO_2$, $HfO_2$, $ZrO_2$ and W. However, other metal oxides, metals, and other inorganic materials may also be prepared using SIS. For example, various known precursors utilized with atomic layer deposition (ALD) in preparation of layers of metal, metal oxide, metal nitride, metal silicide, and metal halide, ternary, and various multi-component metal-containing systems.

In various embodiments of the present methods, the SIS process uses a pair of precursors to form the inorganic protective component where one precursor comprises a metal or metal-containing compound selected to infiltrate into and react with the resist material. The second precursor comprises a compound selected to react with the first precursor (or a portion thereof) bound to the surface and within the bulk of the resist material. The protective component is accordingly synthesized on the surface and within the bulk of the resist material by reaction of the first precursor and the second precursor. Although a wide range of precursors are suitable for SIS-modification, examples of various precursors include, but are not limited to: trimethyl aluminum (TMA), titanium tetrachloride ($TiCl_4$), diethyl zinc (DEZ), and tungsten hexafluoride ($WF_6$). The scope of available precursors and protective components for particular resist materials may be further broadened by performing an initial SIS seed layer to form a metal or metal oxide layer reactive with other precursors. For example, an $Al_2O_3$ seed layer may be utilized to seed the growth of other inorganic materials which do not have direct selective chemistry with pure PS-b-PMMA polymer, e.g., ZnO, MgO, $SiO_2$, etc.

The second precursor is selected in view of the first precursor to carry out the SIS reaction within the resist material to form the protective component. In various embodiments the second precursor may be an oxygen source (e.g., $H_2O$, $O_2$, $O_3$, $H_2O_2$), a reducing agent ($H_2$, $Si_2H_6$, HCOH, etc.), a sulphur source (e.g., $H_2S$), or other compound reactive with the first precursor. One of skill in the art will appreciate that the order of the precursors may be altered in various embodiments and that the nomenclature 'first precursor' and 'second precursor' is used herein for ease of reference. For instance, in some embodiments the second precursor (e.g., $H_2O$, $H_2S$) can be selected to react with or bind to a specific functional group in the resist material and utilized first in the SIS sequence, and the metal-containing precursor can be utilized next in the SIS sequence so as to react with the adsorbed or bound second precursor. One of skill in the art will further appreciate that various systems may comprise more than two precursors. The wide variety of resist material/SIS precursor combinations makes the process applicable to a virtually limitless number of resist materials to which a broad range of protective components may be formed by SIS.

Figure 3:
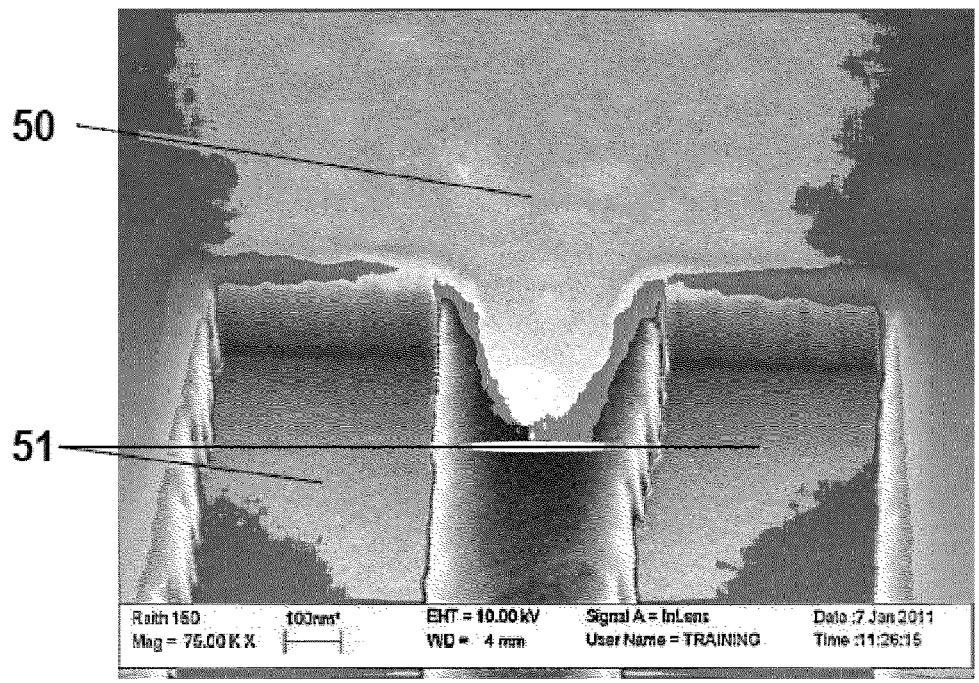
FIG. 3 is a backscattered scanning electron microscope (SEM) image of the resist material of FIG. 2 over a silicon substrate after two minutes of silicon main etch.
Figure 4A:
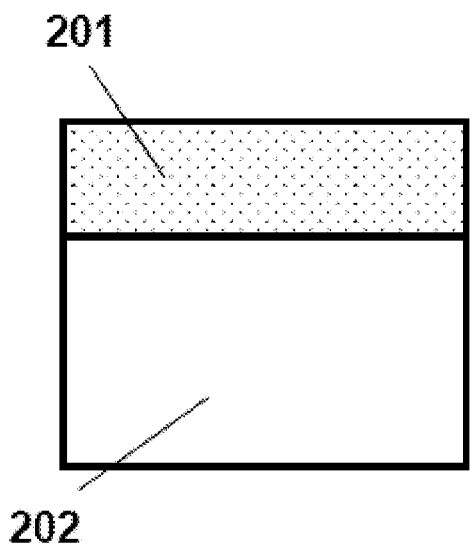
FIGS. 4A-4D are a schematic representation of an embodiment of a process according to the present invention, an organic resist layer 201 overlays a substrate layer 202 (FIG. 4A), a predetermined pattern 203 is prepared in the organic resist layer 201 (FIG. 4B), the patterned resist layer is SIS-modified 201m (FIG. 4C), and an etching process is performed to transfer the pattern 204 to the substrate layer 202 (FIG. 4D)
Figure 4B:
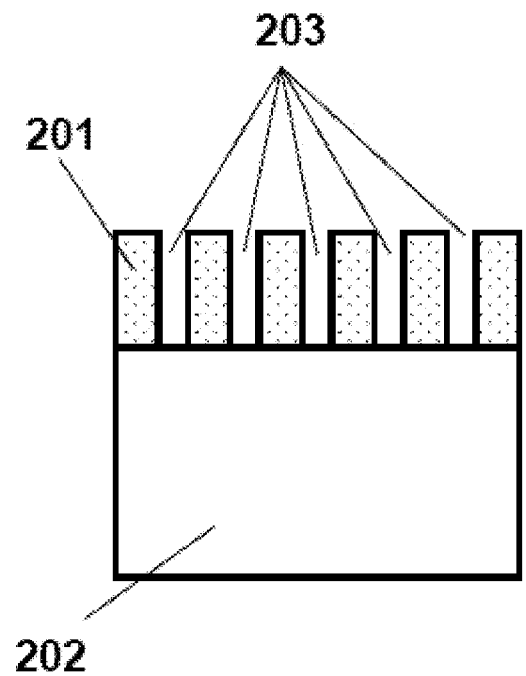
Figure 4C:
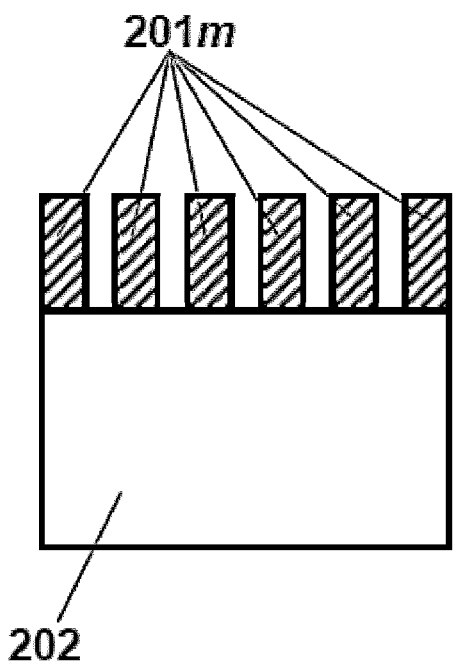
Figure 4D:
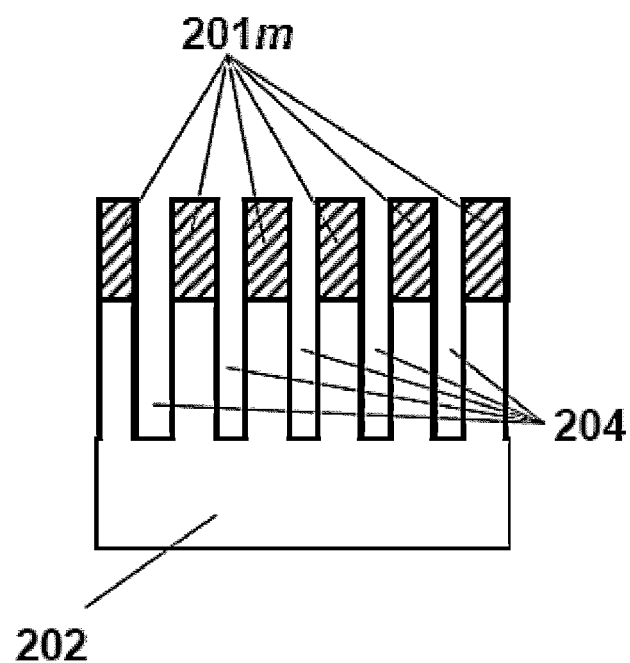

The SIS process results in the protective component infiltrating into the bulk of the resist material layer, not merely coating exposed surfaces of the resist layer. By varying the pressure, temperature, and reaction timing of the SIS process precursors, the depth of penetration of the protective component into the resist layer is controllable. The depth of penetration of the protective component can also be controlled by selecting SIS process precursors with specific diffusivities in the resist material layer. FIG. 2 is energy dispersive X-ray (EDX) imaging of a PMMA resist material modified by $Al_2O_3$. The resist material includes an unmasked area 50 and a masked area 51. The presence of aluminum after 16 seconds of an $Al_2O_3$ breakthrough etching step and two minutes of $HBr/O_2$ silicon etching is represented by the overlay curve 53. Although a portion of the resist layer opposite the substrate has been removed by etching, resulting in a thinning of the resist layer, significant aluminum is still present within the PMMA at this depth. The remaining resist layer is seen in a backscattered SEM image in FIG. 3, illustrating that the reaction between resist layer and the precursors has occurred within—rather than simply on top of—the PMMA layer.

Figure 5:
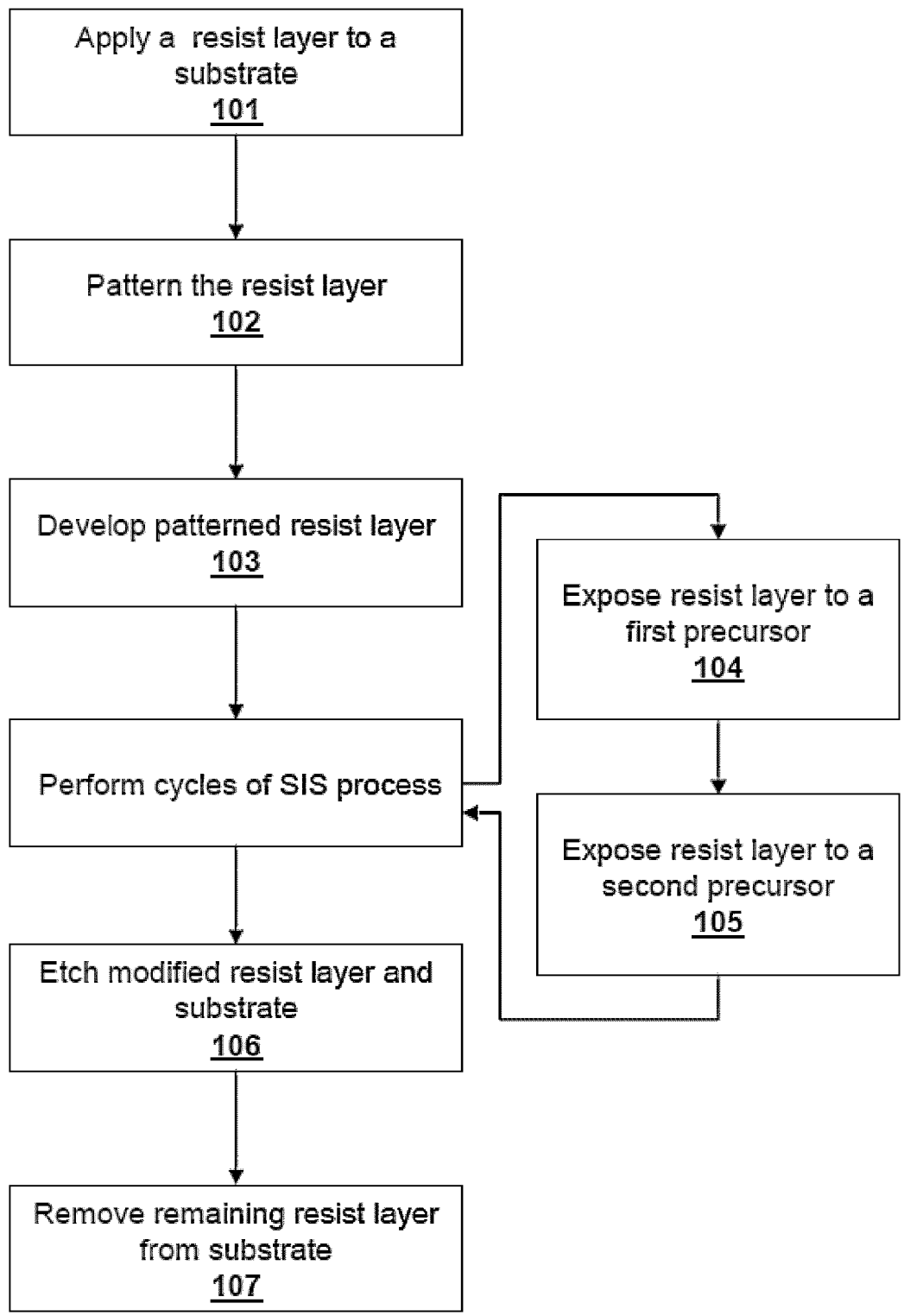
FIG. 5 depicts an embodiment of the process according to the present invention.

The SIS approach may be utilized with a patterned PMMA resist layer. With reference to FIGS. 4 and 5, the PMMA resist layer 201 is applied (step 101) to a substrate 202 such as a silicon substrate. In various embodiments, spin coating may be used to apply the resist layer 201 to the substrate 202; however, other techniques may also be used. Next, a pattern 203 (shown in FIG. 4B) may be applied to the resist layer (step 102). Patterning of the resist layer 201 may be accomplished by a variety of processes known in the art including electron beam exposure, photolithography and polymer self-assembly processes such as block copolymer lithography. In various embodiments, selected areas of the PMMA resist layer are exposed to an electron beam or photons to form the pattern 203. The resist layer 201 is then developed (step 103) using chemical developers such as methyl isobutyl ketone and isopropyl alcohol (MIBK:IPA). It is understood that lithography techniques such as electron beam lithography and photolithography may be used to form the patterned feature of the organic resist. In addition, selection of block copolymers may be used to prepare the patterned feature of the organic resist. In the case of block copolymers, a self-assembled pattern of spheres, cylinders, lamellae, or other nanoscale morphology comprised of two or more polymer blocks such as polystyrene and poly (methyl methacrylate) constitutes the patterned resist layer.

The patterned resist layer 201 is then modified through the SIS process which comprises a plurality of alternating exposures of the patterned resist layer to a metal precursor compound, e.g., trimethyl aluminum (TMA) (step 104) which may be the first precursor, and a reactant precursor, e.g., $H_2O$ (step 105) which may be the second precursor. Each precursor exposure results in a self-limited half-reaction with the resist layer. A purge step (e.g., $N_2$) may be performed following each precursor exposure to remove residual reactant. Exposures of each reactant can be performed in one step or in a series of two or more steps to control the amount of material that infiltrates the resist. In this example, the exposures were carried out at a temperature of about 85° C. and using precursor partial pressures of about 5 Torr. Five SIS cycles were performed with a 60-second TMA exposure and a 300-second $H_2O$ exposure in each cycle. PMMA domains are first modified chemically by reaction with TMA, with the Al of the TMA bonding to the PMMA in a highly controllable fashion, owing to the stepwise molecule assembly process. The TMA precursor infiltrates into the bulk of the PMMA. The second precursor, in this case water, completes the reaction with the Al bonded to the surface and within the PMMA bulk, forming the protective $Al_2O_3$ component. The resulting modified resist layer 201m is then etched (step 106) to form the desired features 204 in the substrate. In various embodiments, the features 204 or a portion of the features may be high-aspect ratio features. As used herein, the term high-aspect ratio refers to features having a depth to length and/or width of at least about 1:1. In particular embodiments, high-aspect ratio is between about 1:1 to about 3:1 and may be between about 1:1 and about 100:1 in still further embodiments. The high-aspect ratio features may be formed without an intermediate hard mask.

Multiple Patterning

In one embodiment, by tuning the strength of the reaction between metal precursors and soft matter (e.g. polymers), the interface between the SIS-synthesized materials and soft matter can be precisely adjusted, as well as the final structure of the composites and templated inorganic materials. For example, poly(4-vinyl pyridine) presents strong coordination reaction with $TiCl_4$ and $Al(CH_3)_3$, which prevents further material diffusion into the polymer and results in hollow tubes and spheres. In further embodiments, the precursor may be selected from, $SnCl_4$, $AlCl_3$, $ZnCl_2$, $CdCl_2$, or any other suitable precursor. For PMMA scaffolds, the reaction between metal precursors and soft matter is not strong enough to block the diffusion of materials into the matrix of PMMA nanodomains, therefore, solid nanorods, nanowires, or nanoposts with precisely-controlled size can be generated.

In further aspects, SIS may be used, as described above, to improve multiple-patterning techniques to decrease the time and cost of LELE and LFLE. Double-patterning is the simplest form of multiple-patterning and exists in three main variants (two of which are shown in FIG. 1): litho-etch-litho-etch (LELE), litho-freeze-litho-etch (LFLE), and self-aligned double patterning (SADP). In the case of LELE, a dense pattern with pitch P is decomposed into two sub-patterns each with pitch 2P. The first sub-pattern is exposed, developed and etched into the first hard mask. The second sub-pattern is then exposed and developed. The assembled patterns are then transferred into a second hard mask, which is used for pattern transfer into the target material. In the case of LFLE, the first sub-pattern is exposed and developed. A "freezing" process is then used to render the photoresist insoluble. A second layer of photoresist is then applied again, exposed and developed with the second sub-pattern. The assembled pattern is then etched into the underlying hard mask or target material. In the case of SADP, a base pattern B1 with pitch 2P is formed. A thin film is then conformally deposited on the substrate and etched back to reveal the base pattern. B1 is then selectively removed and a denser pattern with pitch P is achieved. SADP is best suited for one-dimensional patterns and does not provide as much flexibility in layout as the two previous approaches.

The present invention discloses novel methods of decreasing the feature size while maintaining low cost and high-throughput multiple patterning methods.

In some embodiments, double patterning is contemplated, which is the simplest form of multiple patterning and exists in three main variants (see FIG. 1): litho-etch-litho-etch (LELE), litho-freeze-litho-etch (LFLE), and self-aligned double patterning (SADP).

In the present methods, a resist or substrate undergoes SIS as described above prior to being subjected to a multiple patterning technique such as, in preferred embodiments, LELE or LFLE. The SIS acts to modify the resist such that it withstands plasma etching an order of magnitude better than unmodified resist and facilitates production of high-quality, high-aspect-ratio features. The present invention entails use of SIS to simplify the MPL techniques by replacing one or more of the "hard masks" required for their implementation. An additional advantage is that SIS can replace or supplement the freeze step in a LFLE process.

EXAMPLES

In order to demonstrate the properties of a substrate modified with SIS prior to lithography, an SIS-patterned PMMA resist layer was created.

With reference to FIGS. 4A-4D and FIG. 5, the PMMA resist layer 201 is applied (step 101) to a substrate 202 such as a silicon substrate. In various embodiments, spin coating may be used to apply the resist layer 201 to the substrate 202; however, other techniques may also be used. Next, a pattern 203 (shown in FIG. 4B) may be applied to the resist layer (step 102). Patterning of the resist layer 201 may be accomplished by a variety of processes known in the art including electron beam exposure, photolithography and polymer self-assembly processes such as block copolymer. In various embodiments, selected areas of the PMMA resist layer are exposed to an electron beam or photons to form the pattern 203. The resist layer 201 is then developed (step 103) using chemical developers such as methyl isobutyl ketone and isopropyl alcohol (MIBK:IPA). It is understood that lithography techniques such as electron beam lithography and photolithography may be used to form the patterned feature of the organic resist.

The patterned resist layer 201 is then modified through the SIS process which comprises a plurality of alternating exposures of the patterned resist layer to a metal precursor compound, e.g., trimethyl aluminum (TMA) (step 104) which may be the first precursor, and a reactant precursor, e.g., $H_2O$ (step 105) which may be the second precursor. Each precursor exposure results in a self-limited half-reaction with the resist layer. A purge step (e.g., $N_2$) may be performed following each precursor exposure to remove residual reactant. Exposures of each reactant can be performed in one step or in a series of two or more steps to control the amount of material that infiltrates the resist. In this example, the exposures were carried out at a temperature of about 85° C. and a pressure of about 5 Torr. Five SIS cycles were performed with a 60-second TMA exposure and a 300-second H$_2$O exposure in each cycle. PMMA domains are first modified chemically by reaction with TMA, with the Al of the TMA bonding to the PMMA in a highly controllable fashion, owing to the stepwise molecule assembly process. The TMA precursor infiltrates into the bulk of the PMMA. The second precursor, in this case water, completes the reaction with the Al bonded to the surface and within the PMMA bulk, forming the protective Al$_2$O$_3$ component. The resulting modified resist layer 201*m* is then etched (step 106) to form the desired features 204 in the substrate. In various embodiments, the features 204 or a portion of the features may be high-aspect ratio features. As used herein, the term high-aspect ratio refers to features having a depth to length and/or width of at least about 1:1. In particular embodiments, high-aspect ratio is between about 1:1 to about 3:1 and may be between about 1:1 and about 100:1 in still further embodiments. The high-aspect ratio features may be formed without an intermediate hard mask.

After etching, the remaining SIS-modified resist layer 201*m* may be removed (step 107) using solvent systems or other techniques known in the art. For example, PMMA SIS-modified with Al$_2$O$_3$ (PMMA/Al$_2$O$_3$) can be stripped in a bath of tetramethylammoniumhydroxide (TMAH), which is known to attack aluminum and is found in many photoresist developers. It is also possible to remove the SIS-modified PMMA using a commercially available wet aluminum etchant, comprising a mixture of, for example, H$_3$PO$_4$, CH$_3$COOH, HNO$_3$, and H$_2$O. The SIS-modified PMMA may also be stripped using a solution comprised of ammonium hydroxide and hydrogen peroxide.

The etching step (106) may be adapted in various embodiments to facilitate substrate etching. For example, to initiate etching into the silicon substrate having a SIS-modified PMMA/Al$_2$O$_3$ resist layer, a brief breakthrough etch step is used before commencing etching of the substrate to remove the thin layer of Al$_2$O$_3$ over the substrate in the exposed and unmasked areas. In some embodiment, the first etching step is configured to break through the protective etch component, which may be a thin inorganic material directly covering exposed regions of the substrate as a result of SIS processing. This protective component layer may form from the reaction on the exposed surface of the silicon substrate or the reaction of residual PMMA with the precursors. The initial breakthrough etch step also removes a small amount of SIS-modified resist layer. The etch parameters for the breakthrough etch step are listed in Table 1 for PMMA/Al$_2$O$_3$ but may be altered in view of different protective components formed by SIS. Design of the breakthrough step plays a significant role in initiating etching into the silicon substrate. For example, using a breakthrough etch step designed to remove SiO$_2$ (Table 1) will not initiate etching into the silicon substrate where the Al$_2$O$_3$ comprises the protective component.

TABLE 1

Etch parameters for the Al$_2$O$_3$ breakthrough and Si etching steps.

|  | HBr (sccm) | Cl$_2$ (sccm) | O$_2$ (sccm) | ICP power (W) |
|---|---|---|---|---|
| Al$_2$O$_3$ Breakthrough | 5 | 20 | 0 | 600 |
| SiO$_2$ Breakthrough | 0 | 20 | 0 | 600 |
| Si Main Etching Step | 25 | 0 | 1 | 250 |

ICP: inductive-coupled plasma

Features prepared in substrate materials by photolithography may be characterized by the minimum feature size and maximum feature depth (depth of focus). For various devices prepared by photolithography, there is a desire to minimize feature size formed in the substrate while maximizing feature depth of focus. Minimum feature size and depth of focus are driven by the photolithography process and can be defined by the relationships of Equation 1 and Equation 2, respectively.

$$\text{Minimum\_feature\_size} = \frac{k_1 \lambda}{NA} \quad (1)$$

$$\text{Depth\_Of\_Focus} = \frac{k_2 \lambda}{NA^2} \quad (2)$$

Empirical constants: $k_1$ is about 0.25 and $k_2$ is about 0.4 to about 0.6. $\lambda$ represents the wavelength of the photolithography light source and NA is the numerical aperture which is defined by $\sin(\theta)$ and is about 1 for advanced photolithography tools. Accordingly, current conventional photolithography processes are capable of a minimum feature size of about 50 nm and a depth of focus of about 80 to about 120 nm. To optimize photolithography performance the resist layer must be thin, ideally much less than the depth of focus. Similarly, electron beam lithography also requires a thin resist layer to obtain a small minimum feature size, i.e., improved resolution.

Figure 6:
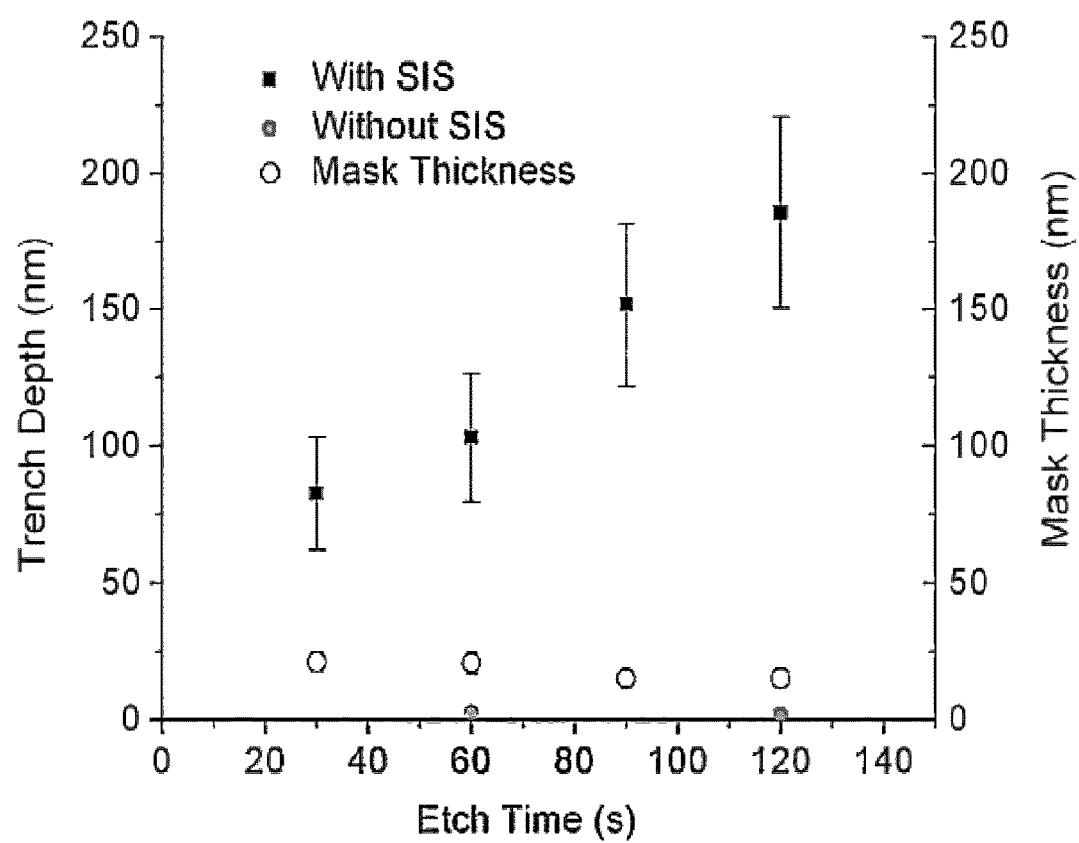
FIG. 6 is a plot of mask thickness and trench depth etched into a Si substrate as a function of the time of the silicon etching step for conventional PMMA resist layers and SIS-modified PMMA having an SIS-$Al_2O_3$ protective component.

SIS-modified resist material layers show significant etch resistance to various etch processes, including an HBr-based Si etch recipe. SIS-modified PMMA can withstand plasma etching during fabrication of deep trenches in the silicon substrate demonstrating an etch rate of one-tenth that of single-crystal silicon. FIG. 6 shows that the improvement in etch resistance enables the fabrication of trenches deeper than 150 nm in silicon, with a starting resist layer of PMMA film only 33 nm thick. Thinner SIS-modified resist layers may also be used. For example, a modified resist layer of about 10 nm could replace a conventional 100 nm resist layer. In comparison, unreacted PMMA alone provides little etch resistance. During the silicon etch step, the mask is etched at ~8 nm/min, about one-tenth of the Si etch rate.

The etch resistance of the SIS-modified resist layer can be modulated by controlling the number of SIS cycles performed. In general, few SIS cycles are needed to significantly increase etch resistance of the resist layer. In various embodiments, from 1 to about 10 SIS cycles are used for extended SIS exposure times, whereas a larger number may be used with shorter SIS exposure times. In particular embodiments, between 2 and 5 SIS cycles are performed. Although the resist layer may be fully infiltrated by the modifying material, modulating the timing, temperature, SIS precursors, and partial pressure of the exposures of the resist material to the SIS precursors controls the depth of infiltration of the SIS treatment. Controlling the SIS infiltration depth permits the resist layer to still be readily removed from the substrate after etching. Thus, by only partially infiltrating the polymer resist material, the deeper portions of the resist proximate the substrate will be preserved as substantially pure polymer film. This will facilitate removal of the resist material (e.g., by dissolving in acetone) after completing the etching process.

Figure 7:
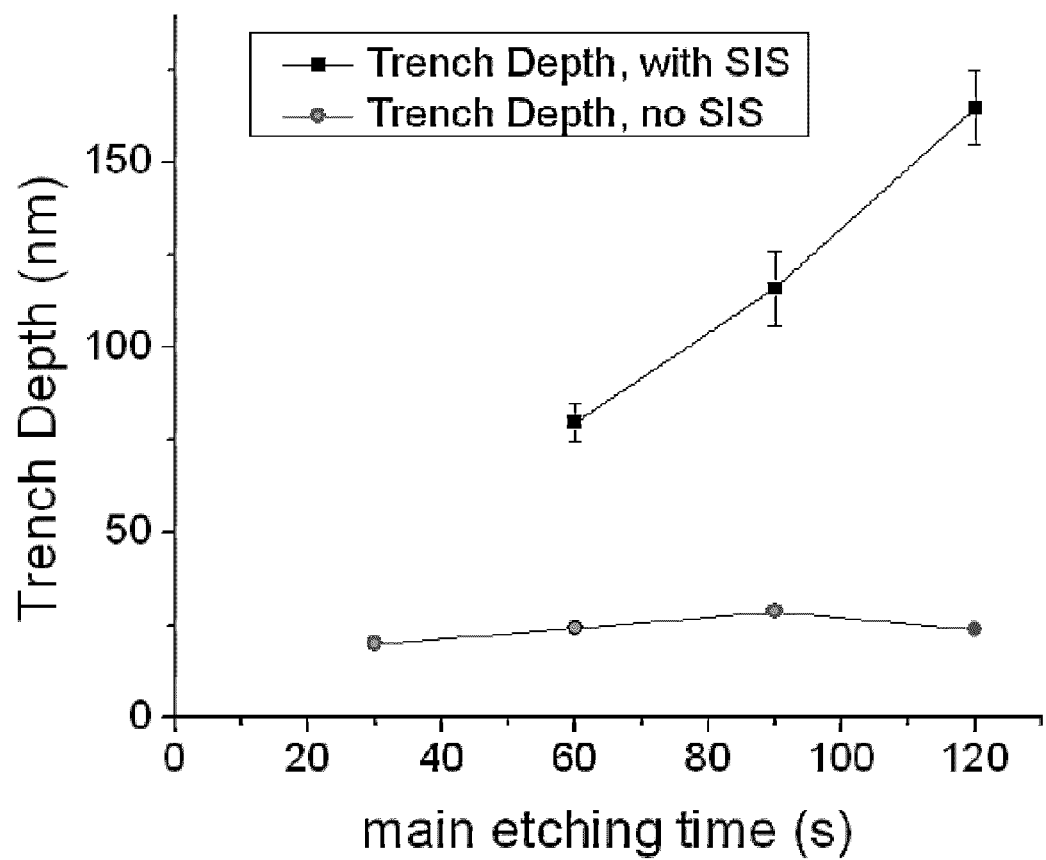
FIG. 7 is a plot of trench depth etched into a Si substrate as a function of the time of the silicon etching step for conventional ZEP520A resist layers and SIS modified ZEP520A with an SIS-$Al_2O_3$ protective component.

FIG. 6 shows a plot of feature depth for a plurality of etched trenches in a silicon substrate fabricated using an e-beam method. Features more than 200 nm deep into the silicon substrate were fabricated after 120 seconds of plasma etching SIS-modified PMMA/Al$_2$O$_3$ resist layer less than 30 nm in thickness. On the other hand, a conventional PMMA resist layer of the same thickness was completely removed from the substrate after 15 seconds of plasma etching without substantial feature transfer to the substrate. SIS-modified PMMA/Al$_2$O$_3$ is estimated to have an etch resistance of about 10:1 compared to silicon (SIS-PMMA:Si). Similarly, FIG. 7 shows a plot of feature depth in a silicon substrate after plasma etching using a SIS-modified ZEP520A/Al$_2$O$_3$ resist layer 50 nm thick. Feature depths achieved with the SIS-modified resist layer are significantly greater than trenches formed using an unmodified ZEP520A resist layer of the same thickness. While feature depth remained substantially constant (about 25 nm) for etch times between 60 and 120 seconds, the trenches were between about 75 and over 150 nm deep over the same time period using SIS-modified ZEP520A.

Figure 8:
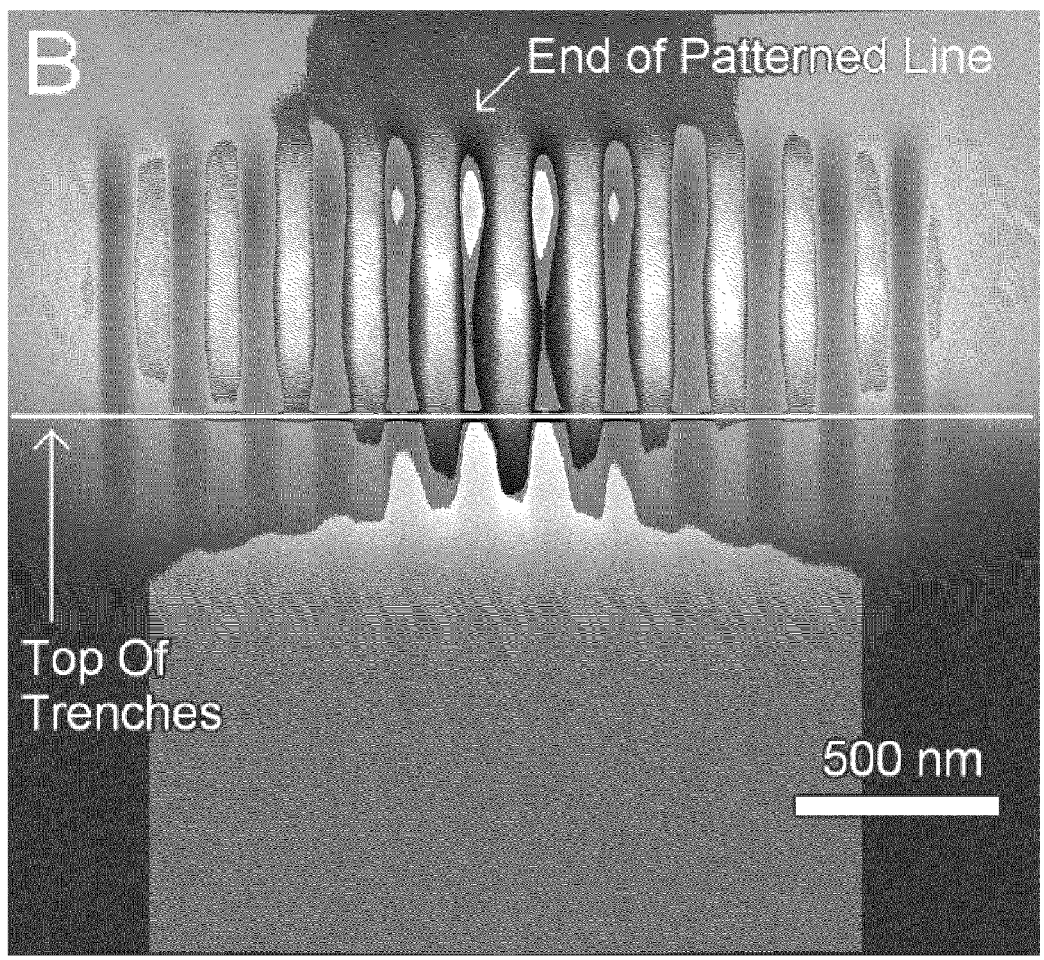
FIG. 8 SEM image of etched trenches (depth ~200 nm, width ~90 nm) in a Si substrate prepared using a 33 nm thick SIS-modified PMMA resist layer without additional hard mask.

Improving the etch resistance of the resist layer by SIS-modification enables fabrication of features, including high-aspect ratio features, in silicon without the need for an intermediate hard mask layer or other procedure that can decrease process efficiency, etch performance and/or etch quality. A range of high-aspect ratio devices and portions of such devices such as DRAM (Dynamic Random Access Memory), interconnect vias, and three-dimensional transistors (e.g., FinFETs) may be made using the SIS-modification process. Potential problems that may arise during hard mask deposition, such as the stress and adhesion of the film, can be avoided as well. The low thermal budget of the SIS process also makes it compatible with most microelectronic fabrication processes. By way of example, FIG. 8 shows a SEM image of a plurality of high-aspect ratio (e.g., greater than 2:1) trenches (200 nm deep by 90 nm wide) formed in a silicon substrate. A 33-nm-thick SIS-modified PMMA/Al$_2$O$_3$ resist layer was used without the aid of an additional hard mask.

Figure 9A:
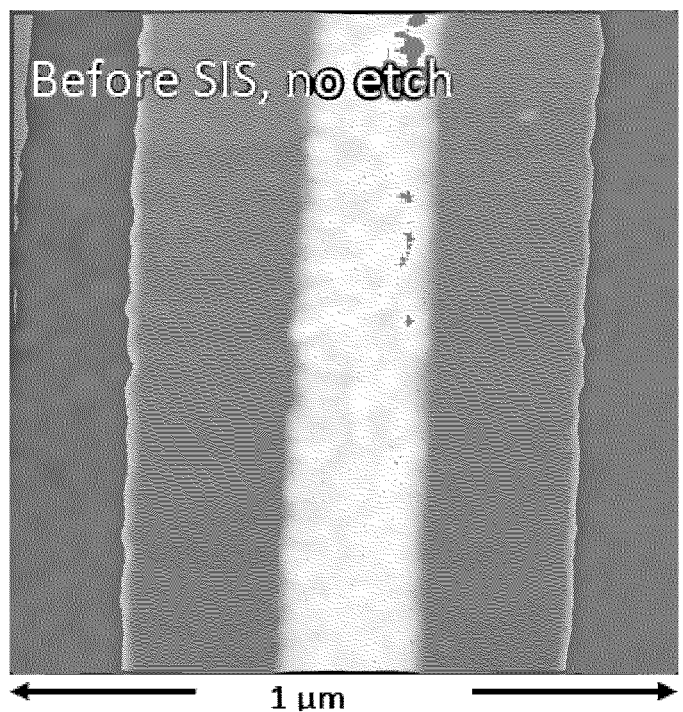
FIGS. 9A and 9B are atomic force microscopy (AFM) topographic images of a PMMA layer before (FIG. 9A) and after the SIS process (FIG. 9B) prior to etching.
Figure 9B:
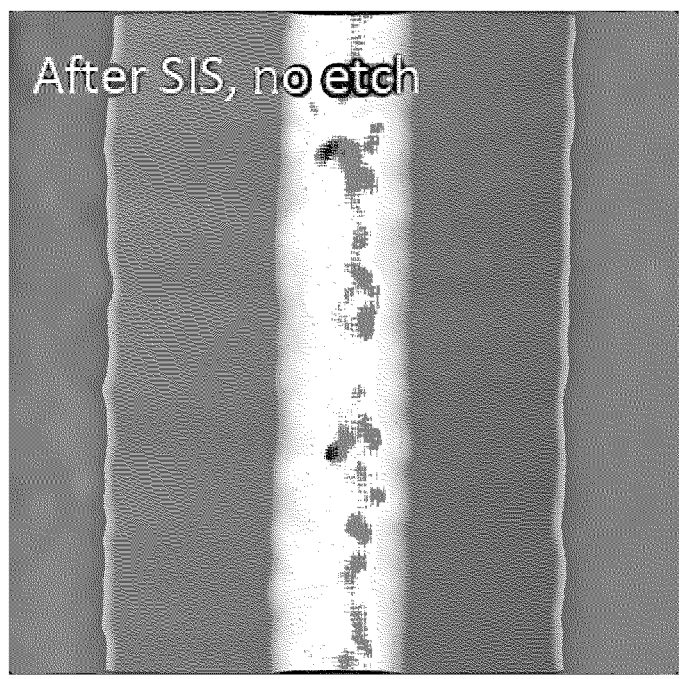
Figure 10A:
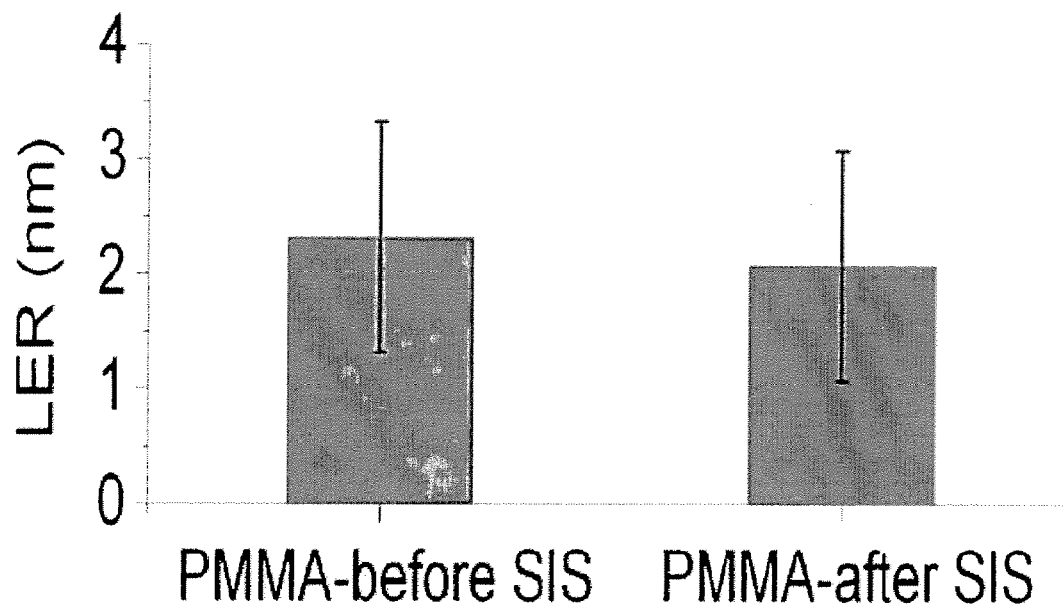
FIG. 10A is a plot of line-edge roughness (peak-to-trough) obtained from the AFM measurements depicted of FIGS. 9A and 9B.
Figure 10B:
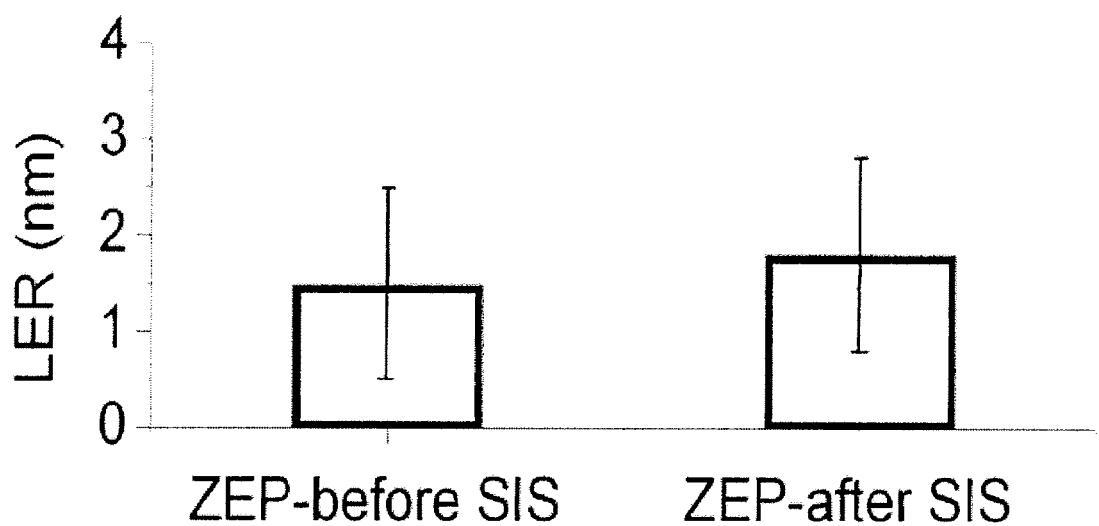
FIG. 10B is a plot of line-edge roughness (1-sigma) obtained from AFM measurements for a ZEP resist layer before and after the SIS process.

SIS modification of the resist layer does not negatively affect quality of the etched features formed in the substrate. In contrast to conventional etch resistance improvement strategies, e.g., silylated resists, that can increase the line-edge roughness (LER) or change the dimensions of the printed pattern, SIS resist layer modification does not suffer from these problems. FIG. 9A shows an atomic force microscope topographic image of a conventional PMMA resist layer and FIG. 9B shows the PMMA resist layer after SIS treatment. FIG. 10A shows that there is little change in the LER when using SIS-modified PMMA/Al$_2$O$_3$. FIG. 10B depicts a similar result for SIS-modified ZEP/Al$_2$O$_3$. Thus, SIS permits realization of both high-resolution properties of PMMA and the etch-resistance properties of Al$_2$O$_3$ and hard masks without degrading the initial printed image in the PMMA resist.

In one embodiment, electron-beam (e-beam) lithography was used to pattern thin PMMA films (thickness: 30-120 nm) on silicon. PMMA was spun on silicon and dried on a hot plate at 180° C. for 90 s. Exposure was performed in a JEOL JBX-9300FS e-beam lithography tool at 100 keV, with doses appropriate for the resist thickness. Following the e-beam exposure, the PMMA resist was developed in MIB-K:IPA (methyl isobutyl ketone:isopropanol) (1:3) for 45 s at −5° C., rinsed for 30 s in IPA, and blow-dried using nitrogen.

The patterned PMMA films were treated by the SIS process to enhance plasma etch resistance. In this experiment, the SIS process was adapted for a commercial reactor capable of large scale batch processing (Beneq TFS500). While the temperature (85° C.) and pressure (5 Torr) were identical to the established process, the reaction time of each half-cycle was lengthened to 600 s, to account for consumption of the precursors by the PMMA film.

The SIS-treated PMMA was used directly as etch mask, and patterns were transferred directly into the silicon substrate using HBr-based plasma chemistry. Following plasma etching, the samples were cleaned in an aqueous solution of hydrogen peroxide and ammonium hydroxide (RCA clean), to remove deposits generated during plasma etching and remaining etch mask material.

Figure 13:
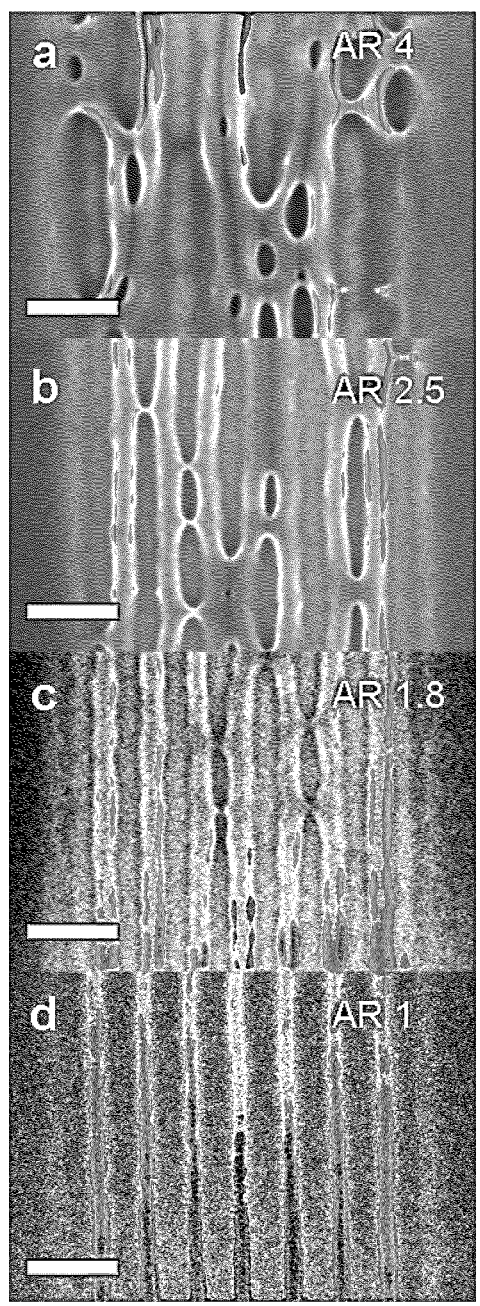
FIGS. 13A-D are SEM images showing how reducing the PMMA thickness can prevent pattern collapse. The test pattern is a series of 30 nm-wide lines in a 60 nm pitch. The resist aspect-ratio (AR) is determined for a 30 nm line. Thickness of PMMA film: a) 120 nm. b) 75 nm. c) 53 nm. d) 30 nm. Scale bar in all images: 100 nm.
Figure 14:
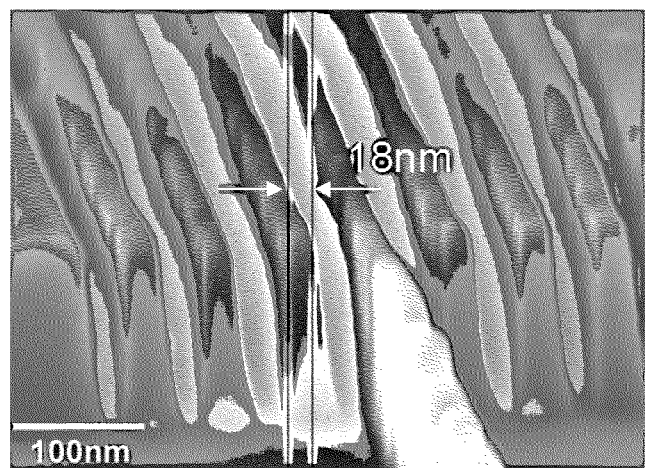
FIG. 14 is an SEM image showing the high aspect-ratio (greater than 6:1), sub-20 nm dense lines etched into silicon using SIS-modified PMMA (5 cycles SIS-$Al_2O_3$), without using an intermediate hard mask.

FIGS. 13A-D show that the reduction of resist aspect-ratio is effective in preventing pattern collapse. Using a resist aspect-ratio of 1 (FIG. 13D), following by SIS enhancement, the structures in FIG. 14 can be fabricated easily: dense lines, narrower than 20 nm, and deeply etched into the silicon substrate were made using SIS-modification of a mere 30 nm-thick PMMA resist film. For comparison, if a SiO$_2$ intermediate hard mask were used, the etch depth of 130 nm shown in FIG. 14 would have required a minimum SiO$_2$ thickness of ~5 nm, using a typical Si:SiO$_2$ selectivity of 25:1 for HBr-based etch chemistry. To fully etch through the SiO$_2$ hard mask, a PMMA thickness of at least 52 nm would be required (the etch rate of PMMA is about 300 nm/min in this hard mask etching step), if no SIS modification were made. FIG. 13C shows clearly that a 53 nm PMMA film is not sufficiently thin to prevent pattern collapse. While much greater etch selectivity between PMMA and SiO$_2$ (or between Si and SiO$_2$) exists in industrial manufacturing tools, the improvement due to SIS-modification would make the entire fabrication process significantly more robust.

Figure 15A:
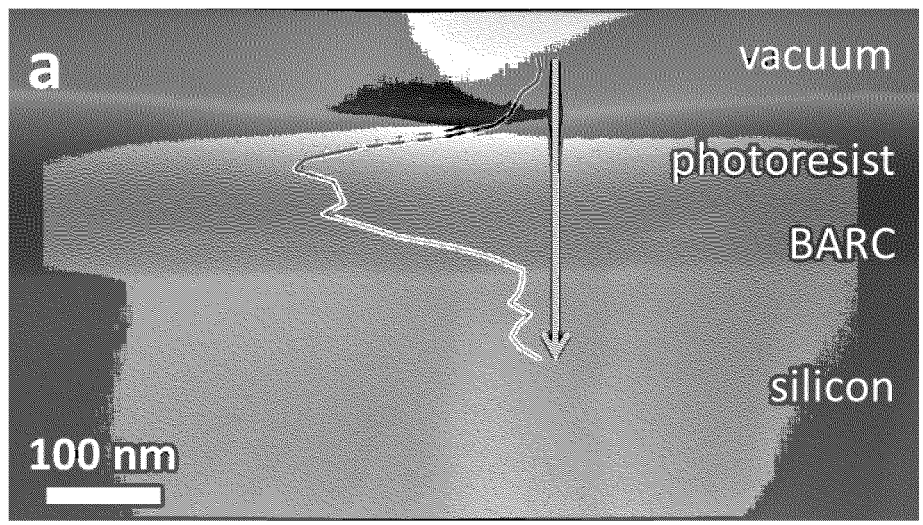
FIG. 15A energy dispersive X-ray (EDX) line scan of a cross section of SIS-modified photoresist on a bottom anti-reflection coating (BARC) on silicon. The dark line in FIG. 15A is the Al K-line signal along the arrow. The trenches etched using SIS-modified photoresist as mask without use of an additional hard mask are shown in FIG. 15B.
Figure 15B:
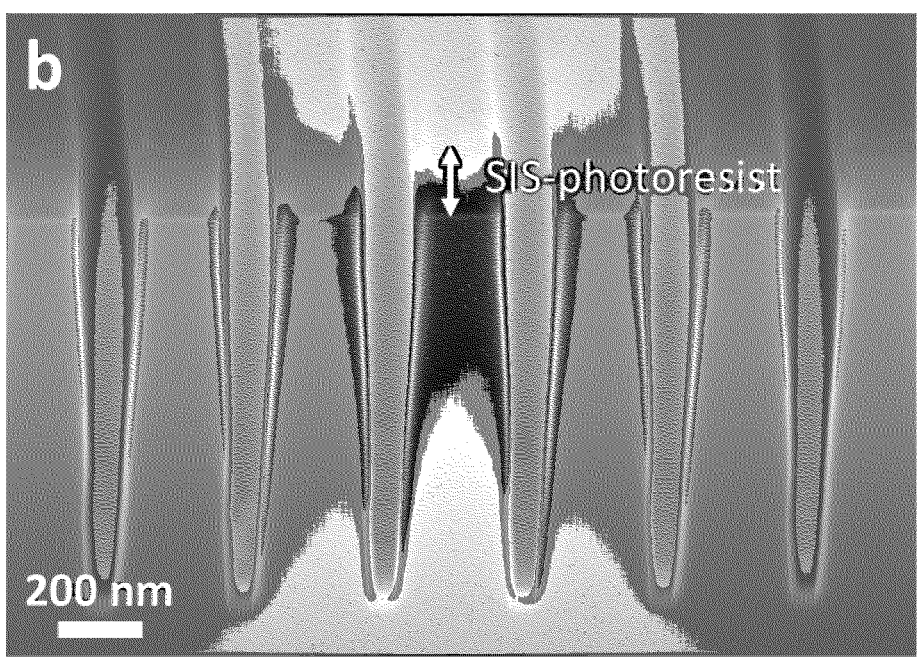

The results obtained above for PMMA are readily applicable to industrial 193 nm photoresists based on a similar polymer. FIGS. 15A and 15B show clearly the infiltration of Al$_2$O$_3$ and the corresponding increase in resistance to HBr-based plasma etching. The photoresist was patterned using established photolithographic and development processes, similar to that in use by industrial facilities. The SIS treatment enhanced the etch resistance of the photoresist by about 60-fold, decreasing the etch rate of the photoresist from ~230 nm/min to <4 nm/min, thus significantly improving its suitability as an etch mask.

The enhancement of a polymeric resist, namely poly (methyl methacrylate) (PMMA), via sequential infiltration synthesis (SIS), is a simple process for manufacturing dense and high-aspect ratio nanostructures. While PMMA is common for laboratory-scale experiments, it is also a major structural component of photoresists used in industrial 193 nm photolithography processes. They share similar chemical and mechanical properties. The results presented herein on PMMA are generally applicable to the broadly used 193 nm industrial photoresist, in regards to reactivity towards SIS precursors and pattern collapse. The etch resistance of thin PMMA films was enhanced to allow dense sub-20 nm features to be defined and transferred deeply into silicon substrates without the use of intermediate hard masks. The SIS process preserves the original pattern quality, as defined by line-edge roughness (LER), and provides a controllable degree of size-tunability. Furthermore, contrary to current industrial processes where LER is degraded by plasma etching, SIS allows the initial LER in the imaging layer to be preserved throughout plasma etching, with negligible change in the dimensions of the patterns. Importantly, the enhancement is sufficiently strong to allow a very thin PMMA film to be used, circumventing pattern collapse. The combination of reduced resist thickness and enhanced etch resistance allows dense and high aspect-ratio nanostructures to be created with simplicity and reliability unavailable in current manufacturing processes. Here PMMA is used as an example, but a vast array of other polymer chemistries are also compatible with SIS processing.

Figure 16A:
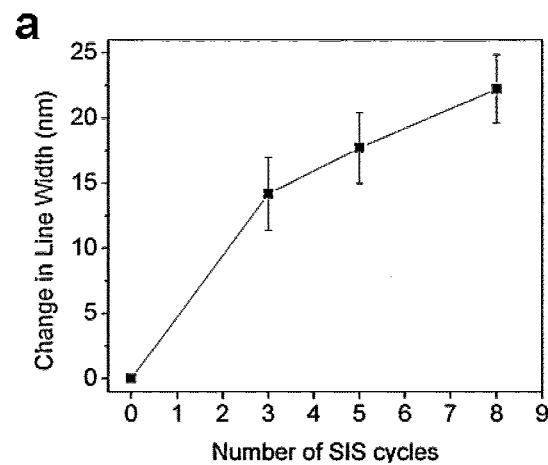
FIGS. 16A-C are graphs showing line characteristics as a function of SIS cycles.
Figure 16B:
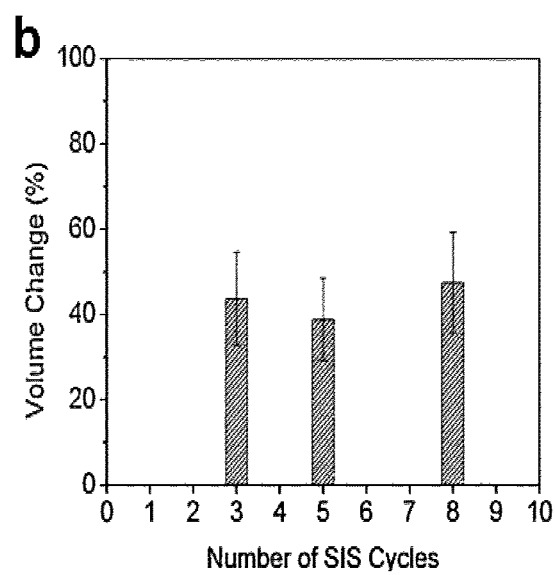
Figure 16C:
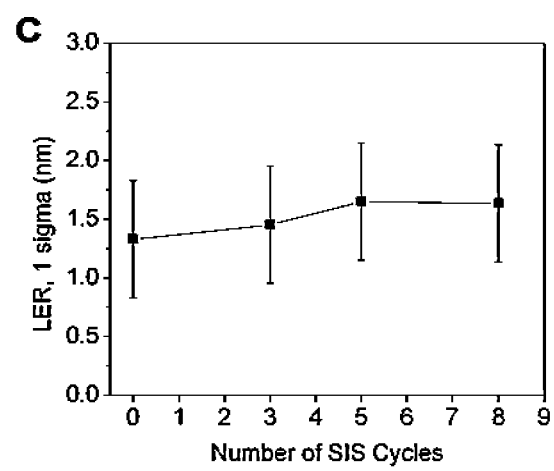

The process of infiltrating polymers with gaseous matter often leads to swelling. SIS modification of PMMA domains in PS-b-PMMA block copolymer may show evidence of such an effect, but the self-limiting property of SIS leads to dimension changes that are highly controllable by varying only the number of SIS cycles. For lithographically patterned PMMA features, FIG. 16A shows evidence of a change in lateral dimensions that is also highly controllable by the number of reaction cycles. Taking into account the change in film thickness, the volume expansion quickly reaches a constant level (FIG. 16B) within the error in metrology, and the changes in lateral dimensions become slower for a larger number of cycles. Most carbonyl reaction sites are saturated within the first few cycles, and it is likely that subsequent SIS reactions result instead in more thin film deposition on the resist pattern than pure SIS growth as the diffusion pathways become filled with alumina. For lithographic purposes, this dimensional control is highly desirable to ensure reproducible results.

Generally, it is advantageous to minimize line-edge roughness (LER) of lithographic patterns. In silicon-based VLSI circuits, LER reduces carrier mobility, introduces significant device-to-device variations, and increases stand-by power consumption. In general, the LER of resist patterns immediately following development is nearly optimal during the fabrication process, since plasma etching frequently causes severe degradation. The SIS modification preserves this optimal LER of as-patterned PMMA. FIG. 15C demonstrates that the line-edge roughness (LER) is unchanged by the SIS process for as many as eight reaction cycles. The LER of the initial PMMA lines has been reduced using cold development, and is comparable to or better than results reported in literature.

Figure 17A:
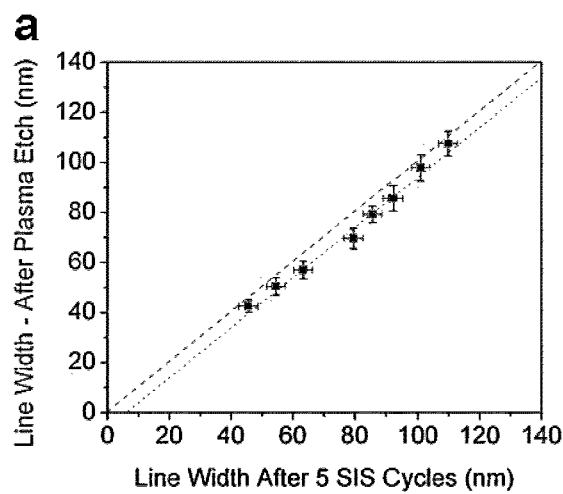
FIGS. 17A and 17B shows the effect of plasma etching on line width.
Figure 17B:
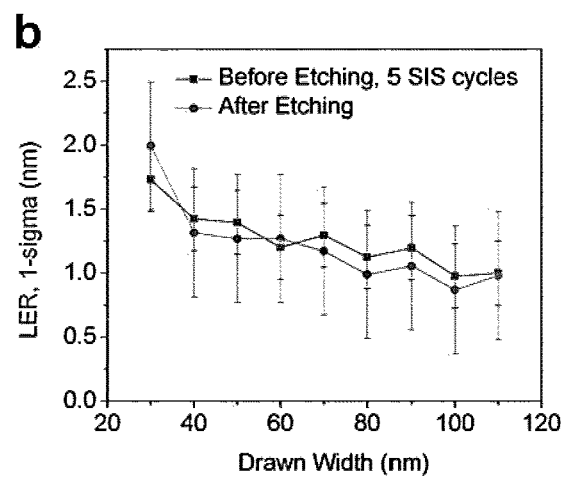

In many cases, the LER and dimensions of the SIS-modified resist patterns are preserved throughout the plasma etching process. Following a short $Al_2O_3$ breakthrough and plasma etching into silicon, the line dimensions and roughness are measured from SEM images following the procedure described in the paragraphs 86 to 88. FIG. 17A shows that the line widths only reduce slightly, mainly due to the breakthrough step. As to the LER, it remains unchanged after the main etching step (FIG. 17B), for all line widths down to 30 nm. These results are marked improvements over industrial processes, where the LER degrades significantly due to erosion of the resist during plasma etching. Although the LER of lines etched into the substrate material can improve with continued etching, the roughness of the resist pattern may never be completely removed. The enhanced etch resistance via SIS modification demonstrated herein presents a simple solution to this important technological challenge.

Collapse of high-aspect-ratio resist structures during wet development is an important problem. In a limited number of applications, such as zone plates for x-ray microscopy, pattern collapse is mitigated by using buttresses between adjacent lines. However, this solution is not applicable to arbitrary patterns. A simple way to prevent pattern collapse is to reduce the resist thickness in order to decrease the aspect-ratio of resist structures. The reduction of resist aspect-ratio after the SIS process is effective in preventing pattern collapse. FIG. 13A-D show that the reduction of resist aspect-ratio is effective in preventing pattern collapse. Using a resist aspect-ratio of 1 (FIG. 13D), followed by SIS enhancement, the structures in FIG. 14 can be fabricated easily: dense lines, narrower than 20 nm, and deeply etched into the silicon substrate were made using SIS-modification of a mere 30 nm-thick PMMA resist film. For comparison, if a $SiO_2$ intermediate hard mask were used, the etch depth of 130 nm shown in FIG. 14 would have required a minimum $SiO_2$ thickness of ~5 nm, using a typical $Si:SiO_2$ selectivity of 25:1 for HBr-based etch chemistry. To fully etch through the $SiO_2$ hard mask, a PMMA thickness of at least 52 nm would be required (the etch rate of PMMA is about 300 nm/min in this hard mask etching step), if no SIS modification were made. FIG. 13C shows clearly that a 53 nm PMMA film is not sufficiently thin to prevent pattern collapse. While much greater etch selectivity between PMMA and $SiO_2$ (or between Si and $SiO_2$) exists in industrial manufacturing tools, the improvement due to SIS-modification would make the entire fabrication process significantly more robust.

The results obtained above for PMMA are readily applicable to industrial 193 nm photoresists based on the same polymer. FIGS. 15A and 15B show clearly the infiltration of $Al_2O_3$ and the corresponding increase in resistance to HBr-based plasma etching. The photoresist was patterned using established photolithographic and development processes, similar to that in use by industrial facilities. The SIS treatment enhanced the etch resistance of the photoresist by about 60-fold, decreasing the etch rate of the photoresist from ~230 nm/min to <4 nm/min, thus significantly improving its suitability as an etch mask.

Therefore, SIS-enhanced imaging layers may be used in high resolution patterning and plasma etching techniques for various applications. Although not bound by theory, the SIS process is understood to not cause uncontrolled size change, nor does it introduce additional degradation to lithographically defined patterns. The SIS process is also understood to prevent pattern degradation during plasma etching. Furthermore, the improved etch resistance allows pattern collapse to be circumvented during wet development, allowing arbitrary nanostructures with high aspect-ratio to be generated with great simplicity. Taken together, these properties may meet the requirements for resist thickness on the International Technology Roadmap for Semiconductors for a decade in the future.

Figure 11:
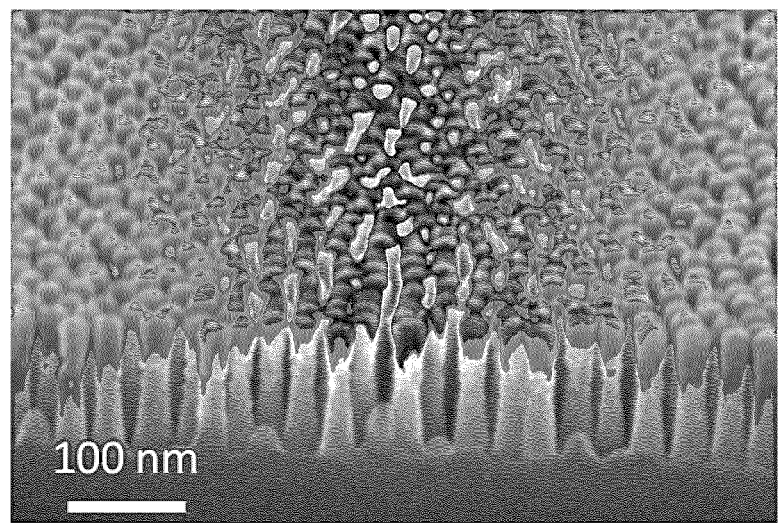
FIG. 11 is an SEM image of patterned nanoscale cylinders in a Si substrate prepared by etching a self-assembled PS-b-PMMA block copolymer resist layer with the PMMA component SIS-modified with SIS-$Al_2O_3$.

FIG. 11 depicts a plurality of patterned nanoscale cylindrical features prepared by etching a Si substrate with a SIS modified self-assembled PS-b-PMMA resist layer. The PS-b-PMMA resist layer comprises a plurality of orientated PMMA microdomains. The PS-b-PMMA resist layer (without intermediate hard mask) was SIS-modified with $Al_2O_3$ to improve etch resistance of the PMMA component. After etching, the SEM image shows the Si substrate patterned with a plurality of tall cylinders with diameters of about 30 nm formed in response to the ordered microdomains of the SIS-modified PMMA.

Figure 12A:
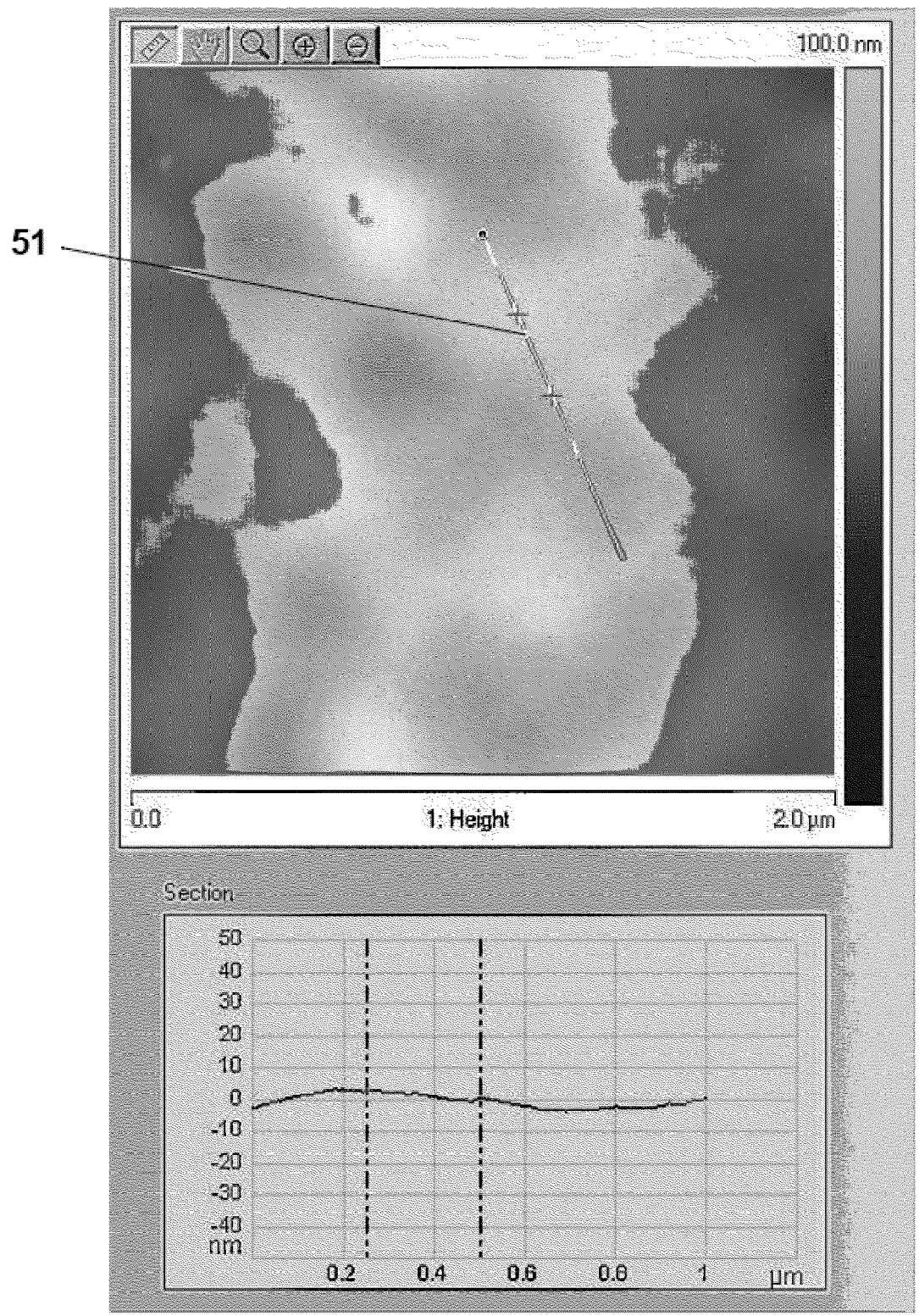
FIGS. 12A-12C are AFM images (upper portion) and AFM line scan data for an ITO substrate with a PS-b-PMMA copolymer resist layer prior to etching (FIG. 12A); after a two-minute plasma etch (FIG. 12B); and after a two-minute plasma etch of a SIS-modified (with SIS-$Al_2O_3$) PS-b-PMMA copolymer resist layer (FIG. 12C)
Figure 12B:
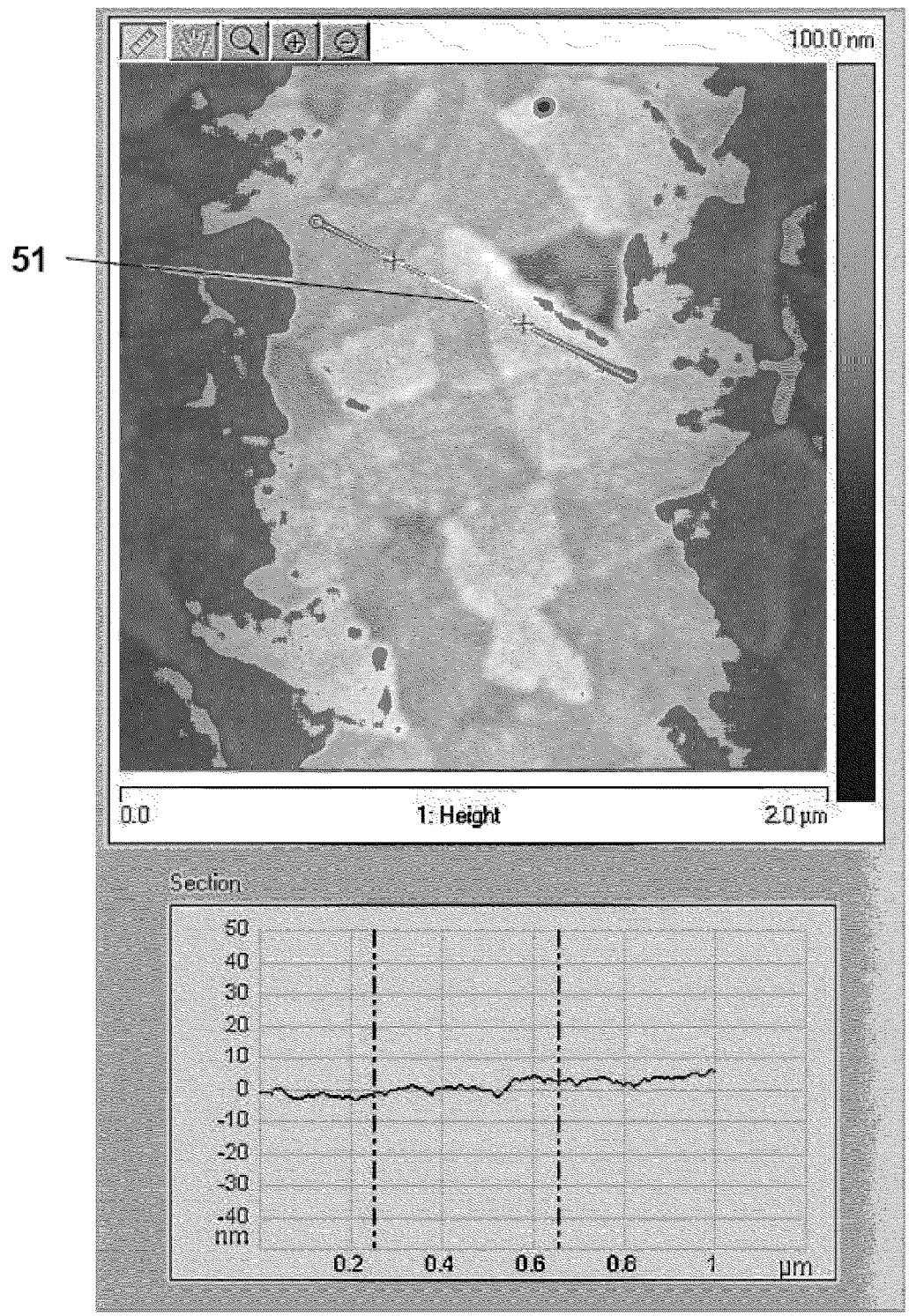
Figure 12C:
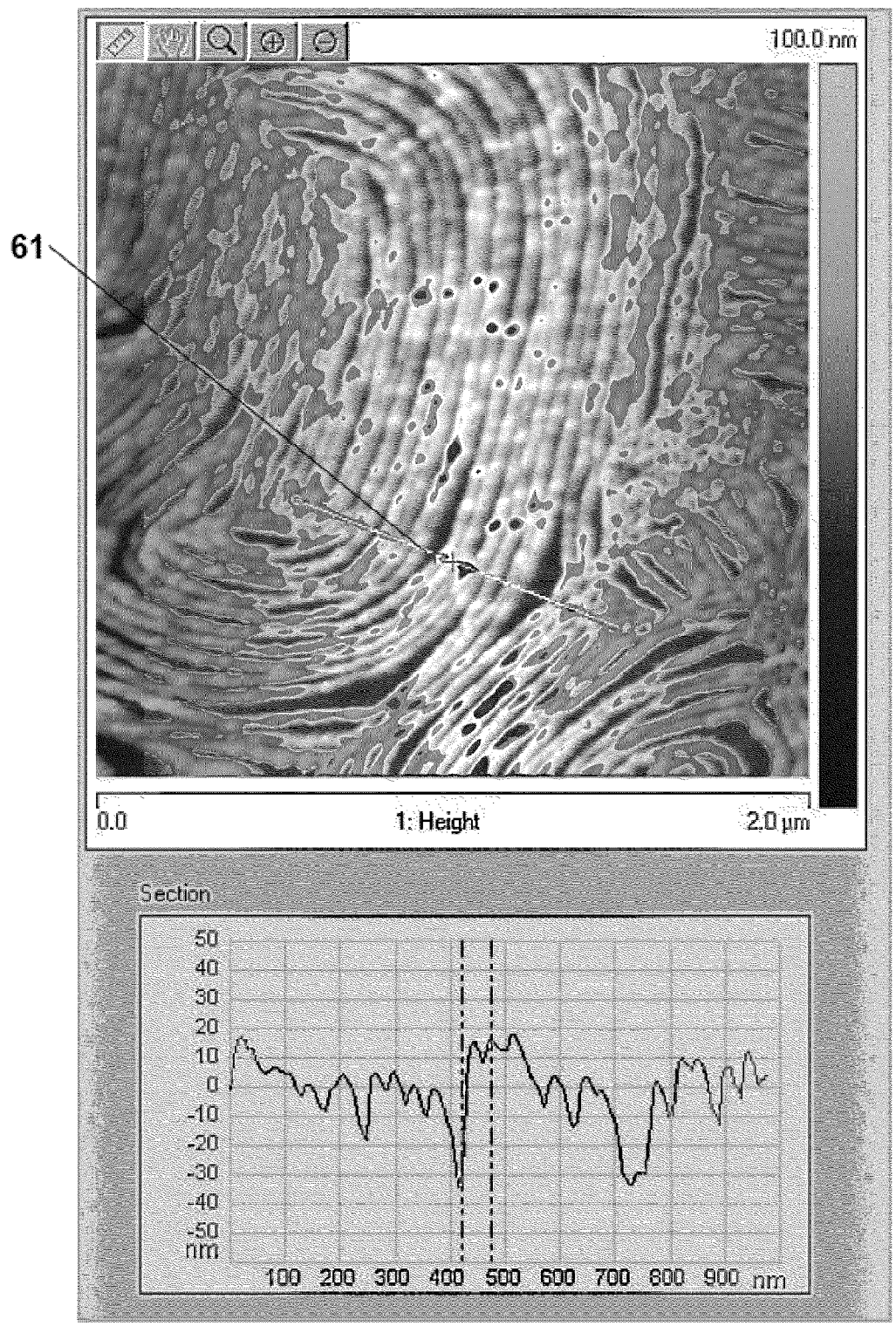

FIGS. 12A-12C show AFM images (upper portion) and corresponding atomic force microscopy (AFM) line scan data (lower portion) for an indium tin oxide (ITO) substrate patterned with a PS-b-PMMA resist layer. FIG. 12A shows an ITO substrate and unmodified resist layer prior to etching. The AFM data taken along the path 51 illustrated in the AFM image show a substantially smooth surface with little change in elevation. FIG. 12B shows an ITO substrate after a two-minute plasma etch using an unmodified PS-b-PMMA resist layer. The AFM data show surface roughness has marginally increased but with little change in surface elevation. The AFM data also show very little change in the surface morphology relative to unprocessed ITO film. FIG. 12C shows an ITO substrate after a two-minute plasma etch using a PS-b-PMMA resist layer SIS-modified with $Al_2O_3$.

On the other hand, the SEM image and corresponding AFM data show the patterned ITO substrate and significant surface elevation changes with troughs exceeding 30 nm.

It is understood that the techniques described in this disclosure may be utilized in various applications. Although lithography and plasma etching were initially developed for the microelectronics industry, they have become essential to other technologies, such as micro-electro-mechanical and microfluidic systems. Indeed, the physical realization of any system with nanoscale components requires a certain degree of top-down patterning. In lithography, an imaging layer (resist) sensitive to light or electrons is exposed to the image of a fine pattern and developed in wet chemicals. Plasma etching is then used to transfer the pattern in the imaging layer to a material of interest. These procedures are then repeated many times to complete a functional system.

Figure 18A:
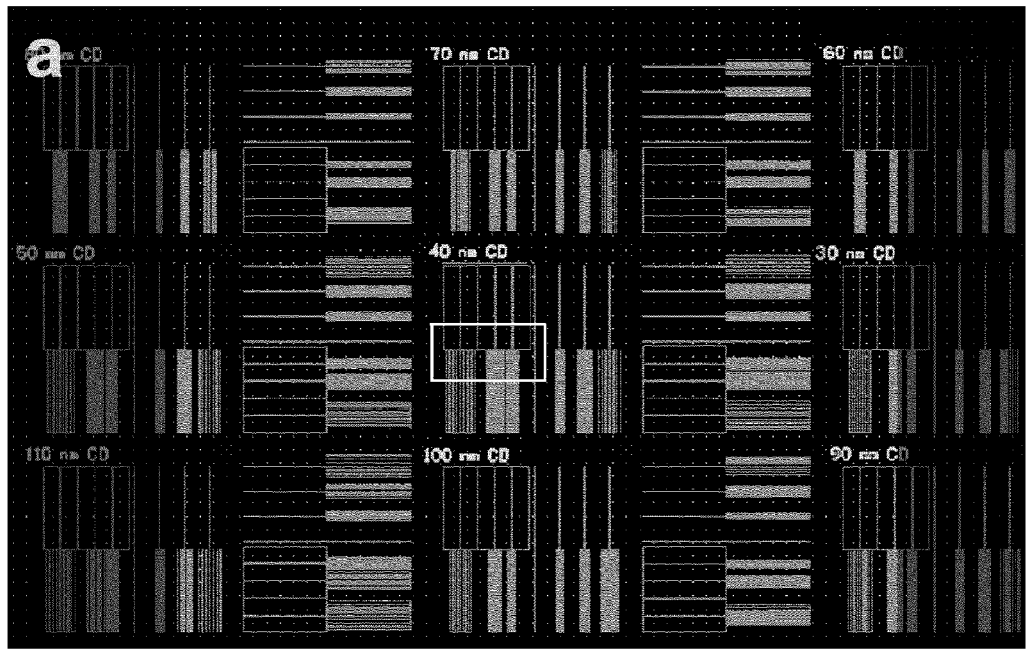
FIGS. 18A and 18B show an example test pattern that can be used.
Figure 18B:
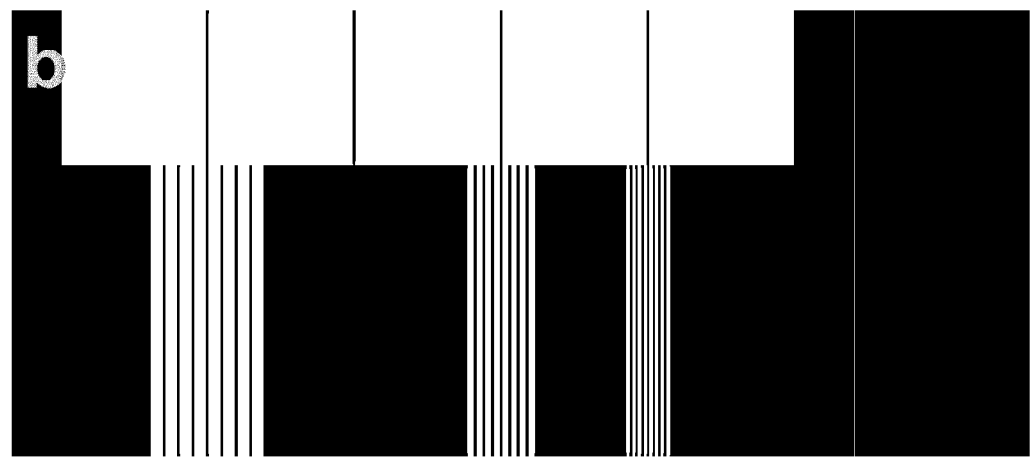
Figure 21A:
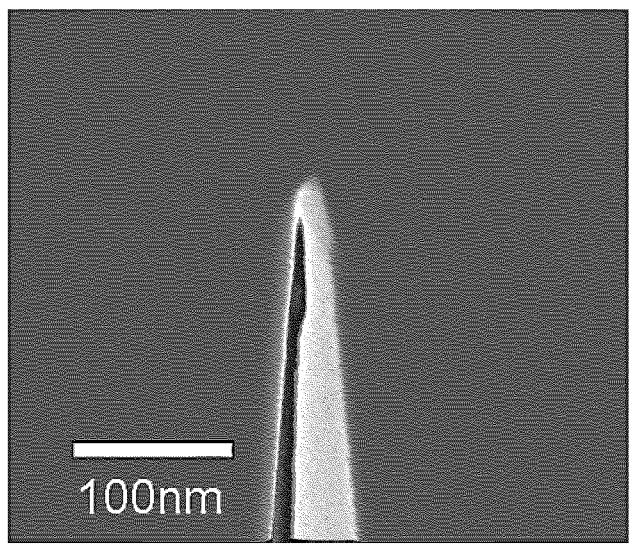
FIG. 21A-C show methodology used to determine line width and line edge roughness using AFM.
Figure 21B:
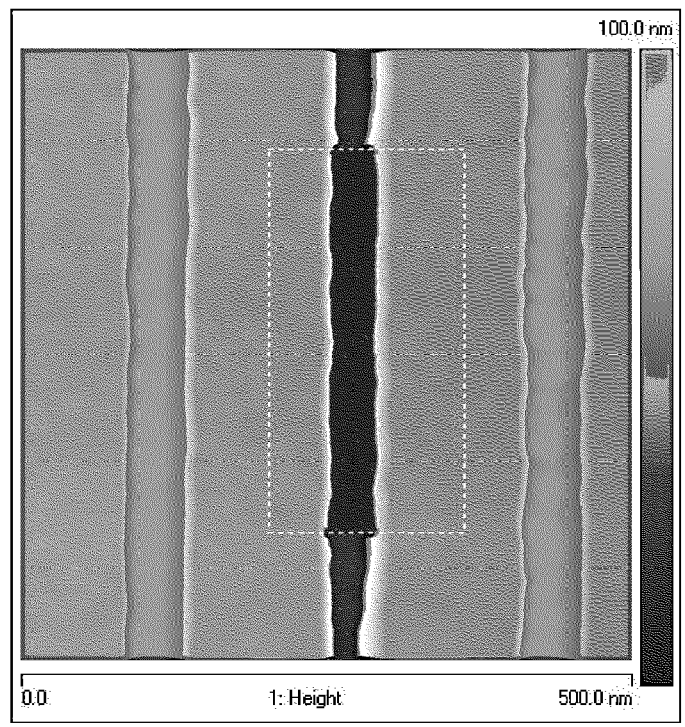
Figure 21C:
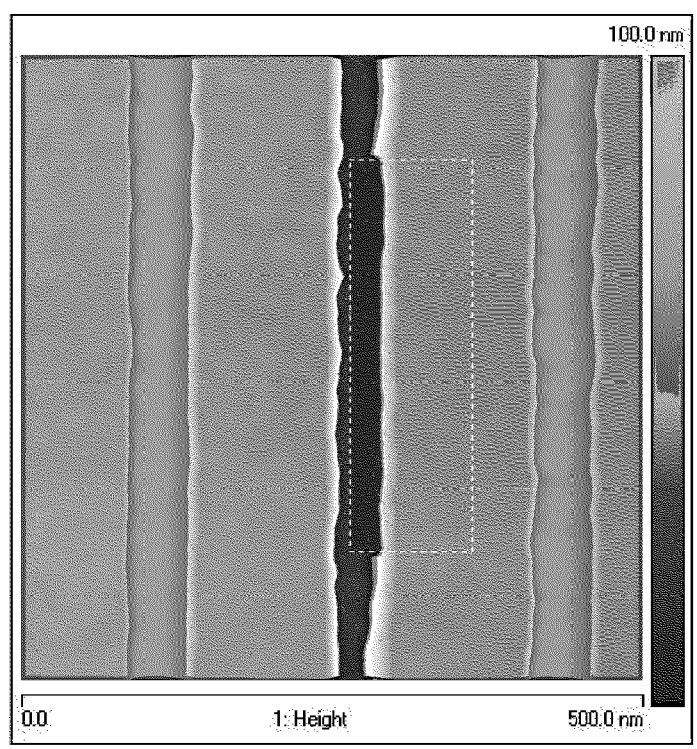

Methodology:

In this disclosure, the line widths and line-edge roughness (LER) were measured using atomic force microscopy (AFM) or scanning electron microscopy (SEM) where appropriate. The lines measured were patterned in 30 nm-thick PMMA and were widely spaced (line/space ratio: 0.25) to allow the AFM tip to reach the substrate as shown in FIG. 18. The AFM tip that was used in the experiments may be approximately 5 nm. FIGS. 21A, B and C show the methodology for determining line width and line edge roughness using AFM.

Figure 19A:
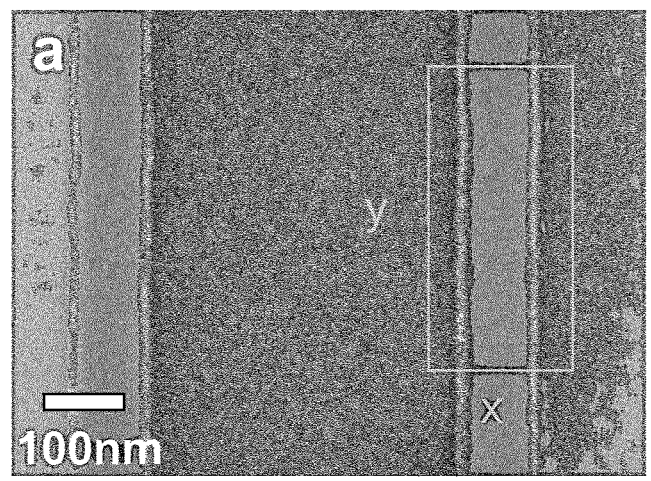
FIG. 19A-B shows the methodology for extracting line width from SEM images.
Figure 19B:
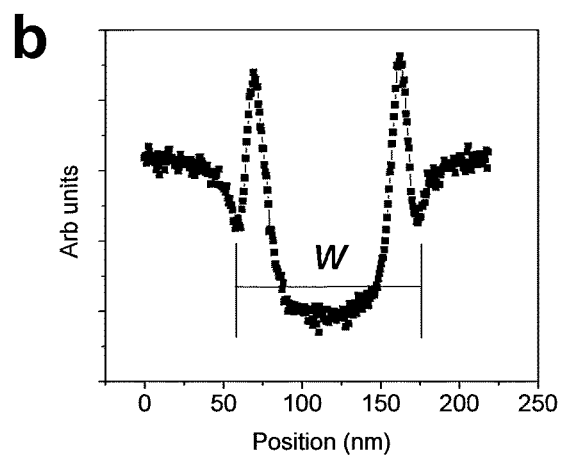

To examine the effects of SIS-treatment, line widths and LER were measured from as-patterned and SIS-treated PMMA patterns using high-aspect ratio AFM tips. AFM was used for metrology in this case because untreated PMMA can be considerably damaged during SEM examination. In the AFM measurements, the line widths are taken as the average width at 50% of the vertical distance from the top of the resist surface using the image analysis software (Veeco, Nanoscope version 7.3). The line width was W as shown in FIG. 19B. The "Width" function and the "Highest Peak" is used a reference, and the line edge is defined as the position where the topography height is 50% of the full resist thickness.

Figure 20A:
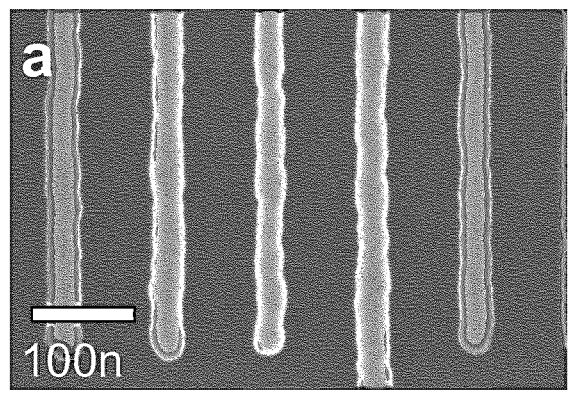
FIG. 20A-C show the methodology for extracting 1-sigma LER from SEM images.
Figure 20B:
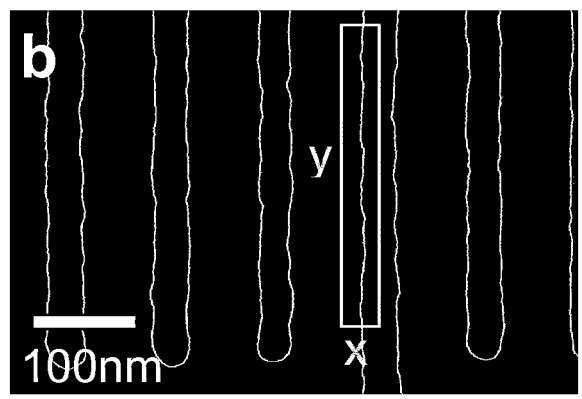
Figure 20C:
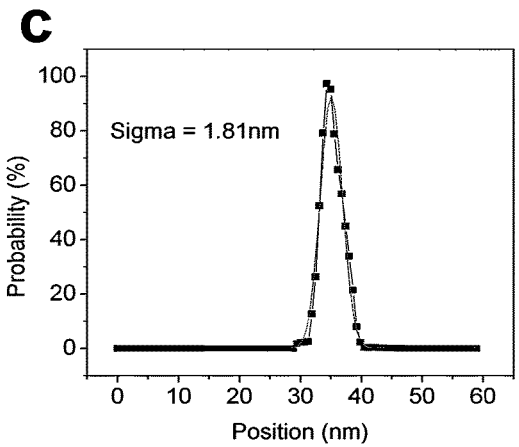

To examine the effects of plasma etching, line widths and LER were measured by SEM on SIS-treated samples before and after plasma etching. SEM was chosen in this case since SIS-treated PMMA did not become damaged during SEM examination and because it provided high spatial resolution. Line widths and LER were extracted from SEM images using ImageJ (available from National Institute of Health, NIH) as shown in FIGS. 20A-C. The standard deviation (sigma) of the Gaussian fit gives the LER (as shown in FIG. 20C). A white pixel is assigned a value of '1', whereas a black pixel is '0.' The grey-scale average gives the probability that a pixel is white at a given position x, matching the definition of LER.

The foregoing description of embodiments of the present invention has been presented for purposes of illustration and description. It is not intended to be exhaustive or to limit the present invention to the precise form disclosed, and modifications and variations are possible in light of the above teachings or may be acquired from practice of the present invention. The embodiments were chosen and described in order to explain the principles of the present invention and its practical application to enable one skilled in the art to utilize the present invention in various embodiments, and with various modifications, as are suited to the particular use contemplated.

What is claimed is:

1. A method of preparing inorganic features for forming multiple-patterned nanostructures, comprising:
    applying a first resist layer to a substrate stack having a substrate and a first hard mask disposed thereon;
    patterning the first resist layer with a first pattern;
    modifying the patterned first resist layer with a first iteration of inorganic features infiltrated within the patterned first resist layer using Sequential Infiltration Synthesis (SIS) treatment;
    applying a second resist layer to the substrate stack;
    patterning the second resist layer with a second pattern;
    modifying the patterned second resist layer with a second iteration of inorganic features infiltrated within the pattered second resist layer using Sequential Infiltration Synthesis (SIS) treatment; and
    engraving a multiple-density pattern reflecting the first pattern and the second pattern onto the substrate.

2. The method of claim 1, further comprising the step of modifying at least one further patterned resist layer with at least one further iteration of inorganic features providing at least one further pattern for the substrate.

3. The method of claim 1, wherein no hard mask is deposited between the substrate and the second iteration of inorganic features.

4. The method of claim 1, wherein the first resist layer and second resist layer comprise a polyacrylate material.

5. The method of claim 1, wherein the first iteration of inorganic features are formed in the first resist layer and the second iteration of inorganic features are formed in the second resist layer, wherein the material of the first resist layer and the material of the second resist layer is selected from the group consisting of poly(methyl methacrylate) (PMMA), poly9methyl glytarimide) (PMGI), phenol formaldehyde resin (DNQ/Novolac), polyhydoxystyrene-based polymers, and polyimides.

6. The method of claim 1, wherein the multiple-density pattern is a double-density pattern.

7. The method of claim 1, wherein the SIS treatment comprises alternating exposures of a first precursor reactive with the first resist layer and a second precursor reactive with the first precursor within the first resist layer to form an inorganic protective etch component within the bulk of the first resist layer.

8. The method of claim 7, wherein the first precursor and the second precursor comprise gas phase precursors.

9. The method of claim 7, wherein the first precursor comprises a metal or metal containing compound, and wherein the inorganic protective etch component comprises a metal oxide or a metal.

10. The method of claim 9, wherein the metal oxide is selected from the group consisting of Al2O3, ZnO, SiO2, HfO2, ZrO2, Nb2O5 and TiO2.

11. A method of lithography comprising:
    applying a first resist layer on a substrate stack,
    patterning the first resist layer to form a first pattern;
    developing the patterned first resist layer;
    infiltrating the developed first resist layer using Sequential Infiltration Synthesis wherein:
    a first precursor is exposed to and infiltrates into the developed first resist layer and reactions with the bulk of the developed first resist layer; and
    a second precursor is exposed to and infiltrates into the developed first resist layer and reactions with the first precursor to form an inorganic component within the developed first resist layer;

etching the substrate stack to engrave the first pattern and the second pattern into a substrate; and removing the developed first resist layer.

12. The method of claim 11, further comprising the steps of applying further resist layers to the substrate stack, and etching the substrate stack to engrave the further pattern into the substrate.

13. The method of claim 11, wherein a hard mask layer is disposed on the substrate and the first pattern is applied to the hard mask and the first pattern is etched into the hard mask layer.

14. The method of claim 11, further comprising a breakthrough etch step before etching the substrate stack to remove an inorganic layer covering exposed regions of the substrate, formed by the Sequential Infiltration Synthesis.

* * * * *